US007813181B2

(12) United States Patent
Cernea

(10) Patent No.: US 7,813,181 B2
(45) Date of Patent: Oct. 12, 2010

(54) NON-VOLATILE MEMORY AND METHOD FOR SENSING WITH PIPELINED CORRECTIONS FOR NEIGHBORING PERTURBATIONS

(75) Inventor: Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/347,864

(22) Filed: Dec. 31, 2008

(65) Prior Publication Data
US 2010/0165738 A1 Jul. 1, 2010

(51) Int. Cl.
G11C 16/04 (2006.01)
(52) U.S. Cl. .................. 365/185.19; 365/189.04; 365/189.07; 365/210.11
(58) Field of Classification Search ........... 365/185.19, 365/210.11, 189.04, 189.07
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,805,499 | A | 9/1998 | Haddad |
| 5,903,495 | A | 5/1999 | Takeuchi et al. |
| 6,011,725 | A | 1/2000 | Itoh et al. |
| 6,046,935 | A | 4/2000 | Takeuchi et al. |
| 6,222,762 | B1 | 4/2001 | Guterman et al. |

(Continued)

FOREIGN PATENT DOCUMENTS

WO   WO2008/083132 A2   7/2008

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Hoai V Ho
*Assistant Examiner*—Anthan T Tran
(74) *Attorney, Agent, or Firm*—Davis Wright Tremaine LLP

(57) ABSTRACT

A page of non-volatile multi-level storage elements on a word line WLn is sensed in parallel while compensating for perturbations from a neighboring page on an adjacent word line WLn+1. First, the programmed thresholds of storage elements on WLn+1 are sensed in the time domain and encoded as time markers. This is accomplished by a scanning sense voltage increasing with time. The time marker of a storage element indicates the time the storage element starts to conduct or equivalently when the scanning sense voltage has reached the threshold of the storage element. Secondly, the page on WLn is sensed while the same scanning voltage with an offset level is applied to WLn+1 as compensation. In particular, a storage element on WLn will be sensed at a time indicated by the time marker of an adjacent storage element on WLn+1, the time when the offset scanning voltage develops an appropriate compensating bias voltage on WLn+1.

19 Claims, 23 Drawing Sheets

U.S. PATENT DOCUMENTS

| | | |
|---|---|---|
| 6,781,877 B2 | 8/2004 | Cernea et al. |
| 7,187,585 B2 * | 3/2007 | Li et al. .................. 365/185.2 |
| 7,196,928 B2 | 3/2007 | Chen |
| 7,436,733 B2 * | 10/2008 | Mokhlesi ............... 365/230.06 |
| 7,471,575 B2 | 12/2008 | Cernea et al. |
| 2006/0018144 A1 | 1/2006 | Oikawa et al. |
| 2006/0140007 A1 | 6/2006 | Cernea et al. |
| 2006/0221692 A1 | 10/2006 | Chen |
| 2006/0221714 A1 | 10/2006 | Li et al. |
| 2007/0133287 A1 | 6/2007 | Hosono |
| 2008/0239824 A1 | 10/2008 | Sekar et al. |

OTHER PUBLICATIONS

EPO/ISA, "Notification of Transmittal of the International Search Report and the Written Opinion of the International Searching Authority, or the Declaration," corresponding International Patent Application No. PCT/US2009/068290, mailed on Jun. 2, 2010, 12 pages.

* cited by examiner

Programming into four states represented by a 2-bit code

Wherein the input sensing voltage $V_{INWL}(t)$ has a predetermined constant ramp rate — 512

FIG. 18

Wherein said determining the time marker for a storage element includes detecting the conduction current by a sense amplifier coupled to the storage element via a bit line, the time marker being the detection time at the sense amplifier offset by a predetermined delayed period — 532

FIG. 19

Wherein said determining the threshold voltage VTi of each storage element by evaluating the word line response function at the position of the storage element at a time indicated by the time marker ti amounts to evaluating the input voltage function at the detection time at the sense amplifier shifted in time by a predetermined word line delay and the predetermined bit line delay (i.e. $VTi = V_{WL}(xi, ti) = V_{INWL}(t' - \Delta T_{WL}(xi) - \Delta T_{BL}(y))$) — 540'

FIG. 20

DLA READ Scheme:
Program Verify on WLn with WLn+1 offset lower by ΔVv

DLA READ Scheme:
Read WLn with Biasing WLn+1 (1 bit correction)

Part 1 of Prior DLA Read Scheme:
Sensing adjacent Word line WLn+1

Scanning Sense Voltage for Sensing
Adjacent Word Line WLn+1

Sensing WLn with DLA Corrections for WLn+1 Perturbating states

NON-VOLATILE MEMORY AND METHOD FOR SENSING WITH PIPELINED CORRECTIONS FOR NEIGHBORING PERTURBATIONS

CROSS REFERENCE TO RELATED APPLICATIONS

This application is related to the U.S. patent application Ser. No. 12/347,876, entitled "Non-Volatile Memory And Method With Continuous Scanning Time-Domain Sensing" by Raul Adrian Cernea, filed on Dec. 31, 2008, which application is incorporated herein in its entirety by this reference.

FIELD OF THE INVENTION

This invention relates generally to non-volatile semiconductor memory such as electrically erasable programmable read-only memory (EEPROM) and flash EEPROM, and specifically to sensing operations performed at high speed in the time-domain.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together. In general, a physical page is formed from a corresponding page of storage elements. If each storage element of the page is storing a bit of data, then the physical page contains one data page. If each storage element is storing multiple bits (e.g., 3 bits) of data, then the physical page will contain 3 data pages (e.g., lower, middle and upper bit pages.)

While increasing parallelism improves read or sensing performance, prior sensing techniques are becoming increasingly time-consuming with the increase in storage density by having each storage element storing more and more bits of data. For example, in a traditional 1-bit memory, each storage element is programmed to either one of two memory state lying in two respective threshold zones of the storage element. Typically, the sensing needs be preformed relative to one read level corresponding to a demarcation threshold level in order to distinguish between the two states. On the other hand, in a 3-bit memory, the threshold window of a storage element is partitioned into at least 8 threshold zones, each corresponding to one of eight memory states. Sensing a 3-bit storage element will require at least 7 read levels in order to resolve in which of the threshold zones the threshold of the storage element lies. In general, an n-bit memory would require sensing $2^n-1$ sensing levels and sensing at each level will incur setup time.

The sensing time is further lengthened when corrections are made for perturbation due to various charges programmed into neighboring storage elements. For example, a page is typically accessed by a common word line. When word line WLn is being read, word line WLn+1 must first be read in order to determine the perturbation. This could compound the total number of sensing levels to $(2^n-1)(2^n-1)$. Likewise, the setup time for each sense level will compound.

Therefore there is a general need for high capacity and high performance non-volatile memory. In particular, there is a need to have a high capacity nonvolatile memory with improved sensing performance where the aforementioned disadvantage is minimized.

SUMMARY OF INVENTION

Sensing with Pipelined Corrections for Neighboring Perturbations

According to another aspect of the invention, a page of non-volatile multi-level storage elements on a word line WLn is sensed in parallel while compensating for perturbations from a neighboring page on an adjacent word line WLn+1. In a "Direct Look Ahead" sensing scheme, a bias voltage depending on a neighboring state is applied to WLn+1 to compensate the cells being sensed on WLn having such a neighboring state. First, the programmed thresholds of storage elements on WLn+1 are sensed in the time domain and encoded as time markers. This is accomplished by a scanning sense voltage increasing with time. The time marker of a storage element indicates the time the storage element starts to conduct or equivalently when the scanning sense voltage has reached the threshold of the storage element. Secondly, the page on WLn is sensed while the same scanning voltage with an offset level is applied to WLn+1 as compensation. In particular, a storage element on WLn will be sensed at a time indicated by the time marker of an adjacent storage element on WLn+1, the time when the offset scanning voltage develops an appropriate compensating bias voltage on WLn+1.

Prior DLA schemes require each of the multiple levels of the multi-level memory to be sensed on the current word line WLn and sensing at each of these levels is further multiplied by the number compensation levels on the adjacent word line WLn+1. Owning to the delay in a word line, sufficient time (e.g., 10 microseconds) must be allowed before the entire length of WLn+1 is precharged to the desired compensation level. The total DLA sensing time is therefore compounded by the delay in setting up each compensation level on WLn+1.

In the present inventive scheme, the offset scanning voltage applies the various compensation levels on the adjacent word line WLn+1 in one sweep and the word line delay period for each infinitesimal compensation level will be "pipelined" one after each other. This results in substantial reduction of the total setup time for all the compensation levels and therefore in improved sensing performance.

BRIEF DESCRIPTION OF THE DRAWINGS

FIG. 18 is an additional portion of the flow diagram shown in FIG. 17 in which the input scanning voltage is preferably a linear ramp voltage.

FIG. 19 is an additional portion of the flow diagram shown in FIG. 17 in which a preferred implementation of the sensing is specified.

FIG. 20 is an additional portion of the flow diagram shown in FIG. 17, in which a preferred implementation of deriving the threshold of a storage element in the continuous scanning technique is specified.

DETAILED DESCRIPTION OF THE PREFERRED EMBODIMENTS

Memory System

FIG. 1 to FIG. 12 provide example memory systems in which the various aspects of the present invention may be implemented or illustrated.

FIG. 13 to FIG. 21 illustrate context and details of the various embodiments according to a first aspect of the present invention of time-domain sensing.

FIG. 22 to FIG. 30 illustrate context and details of the various embodiments according to a second aspect of the present invention in which the time-domain sensing technique is applied to sensing on a current word line while compensating for perturbations from an adjacent word line.

Figure 1:
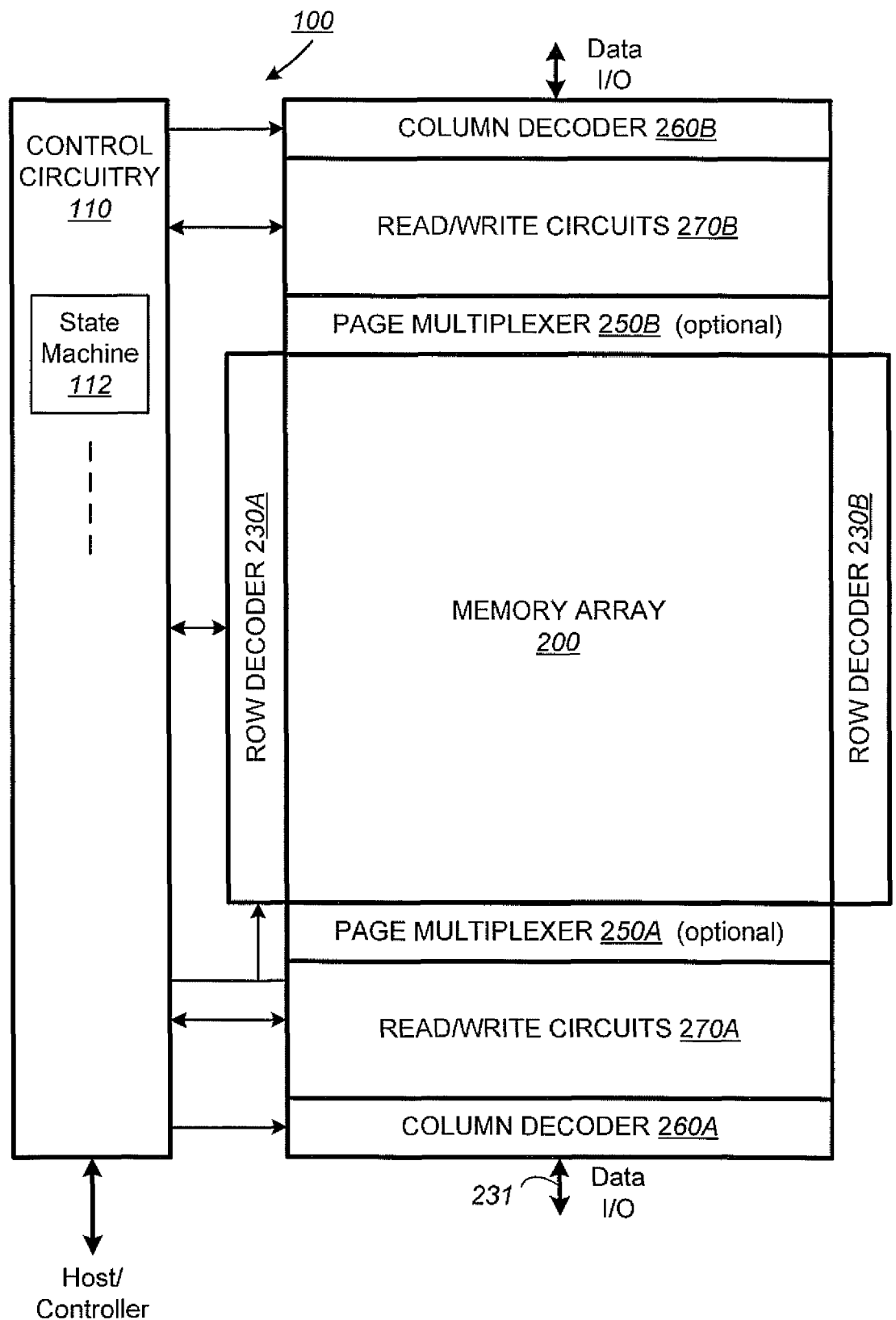
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
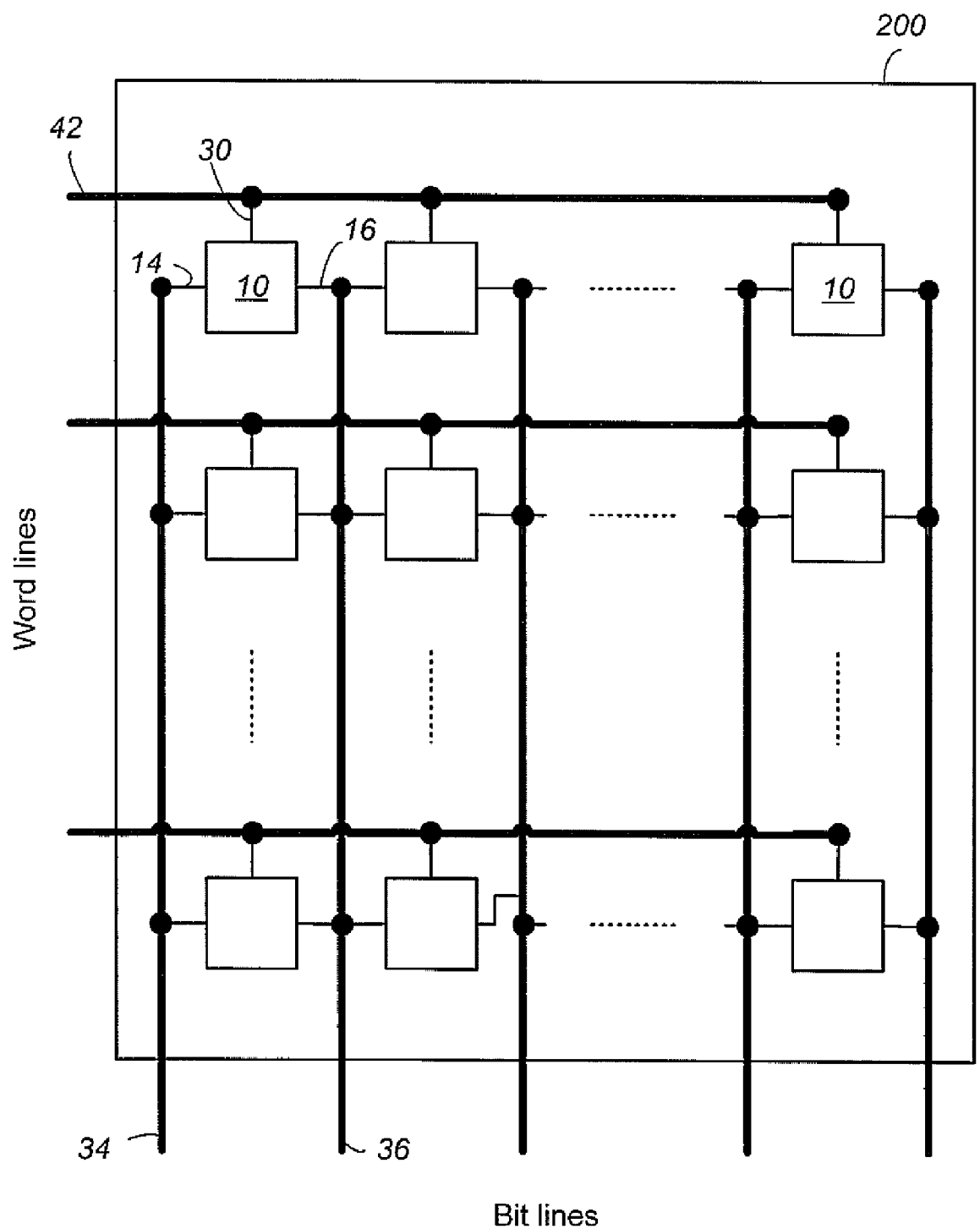
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
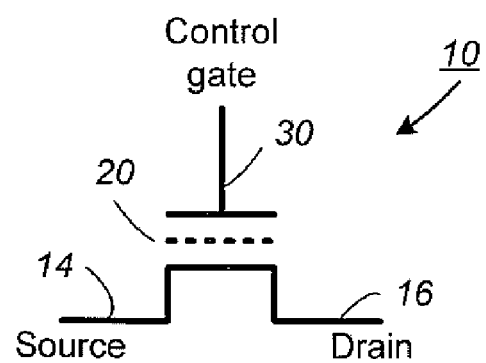
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
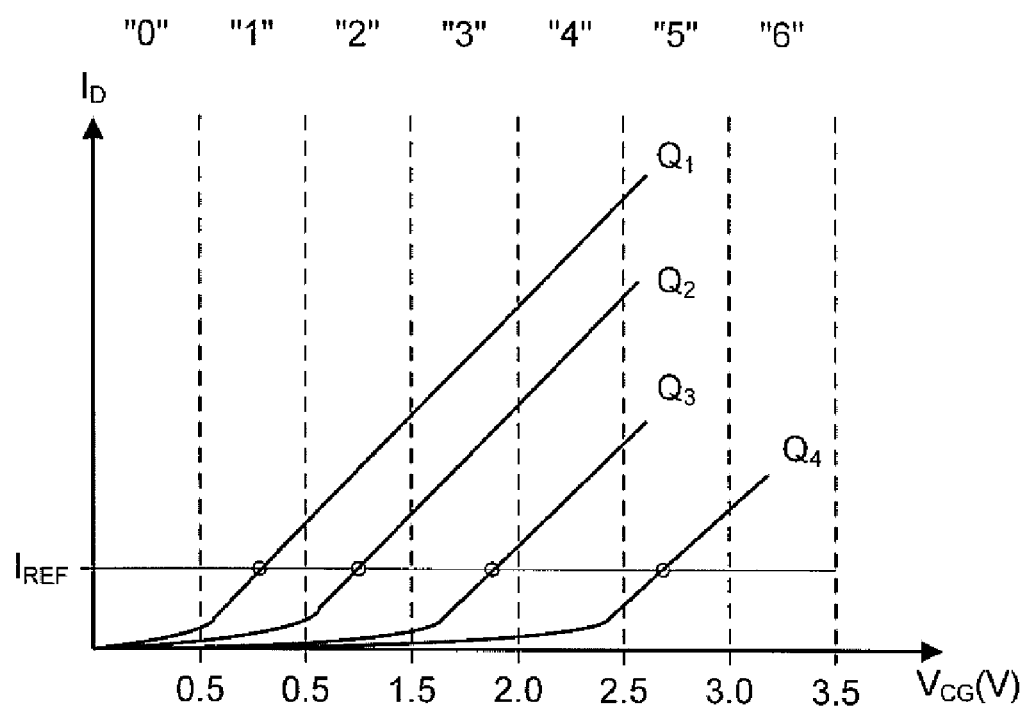
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
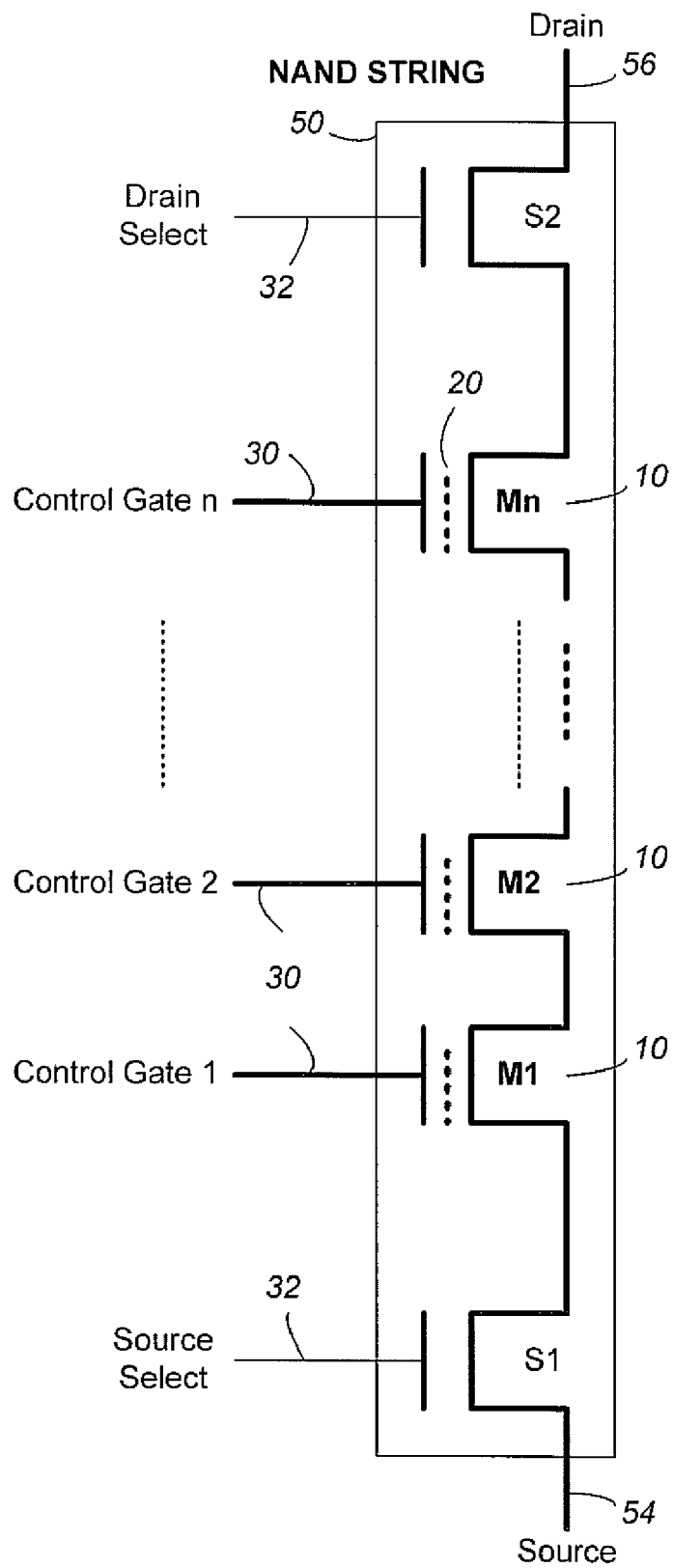
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors 51, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
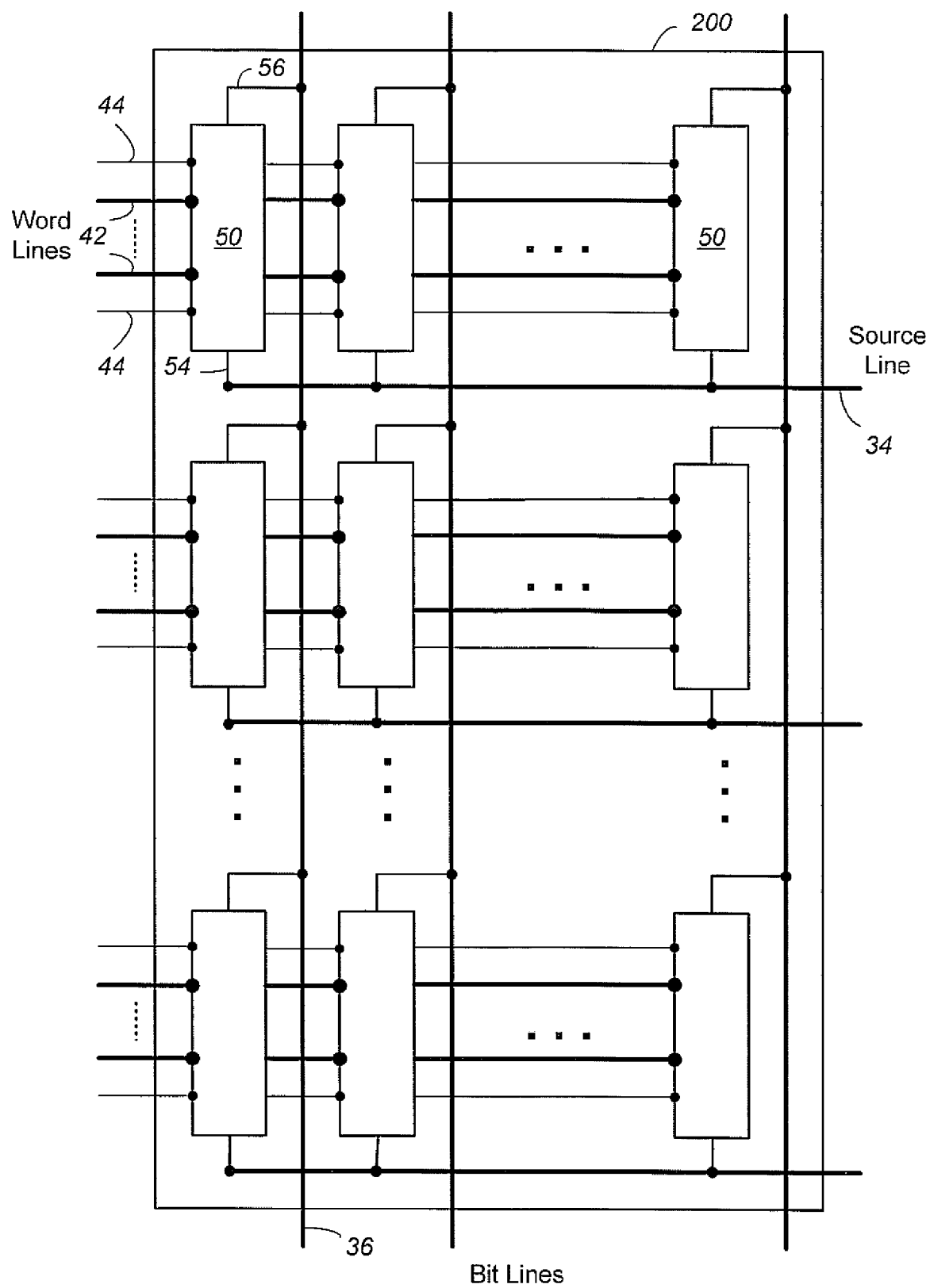
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
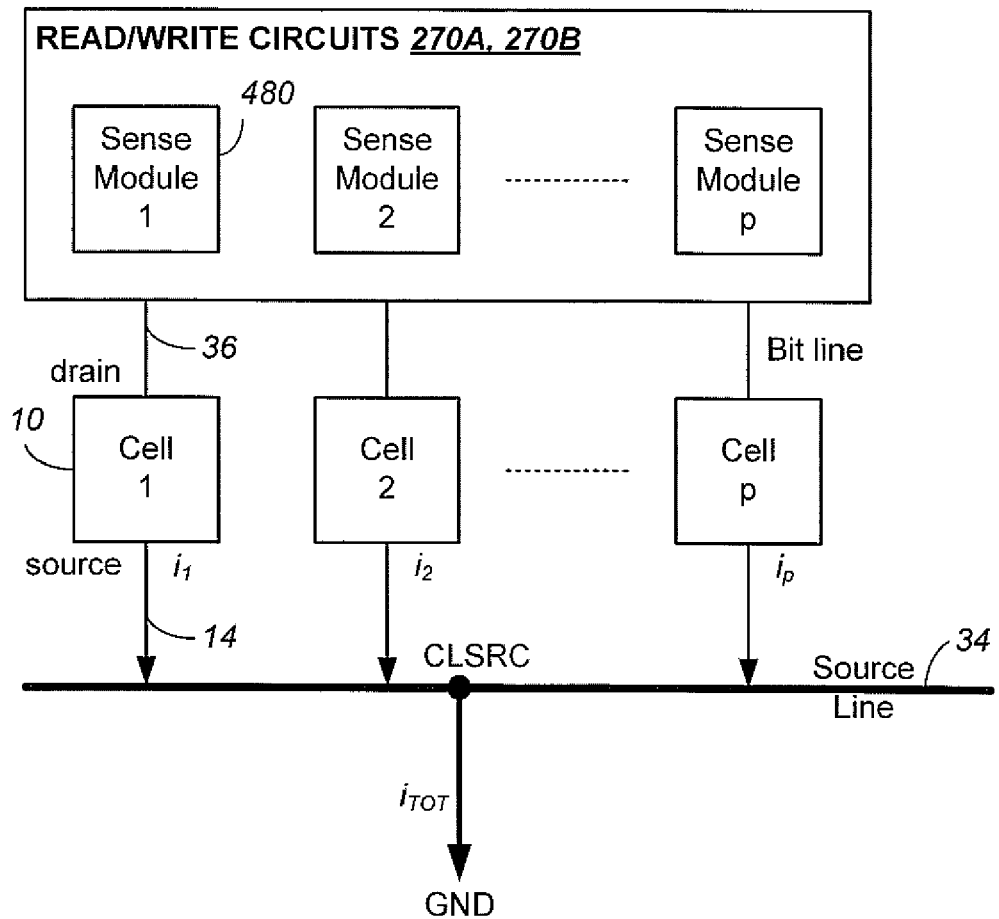
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
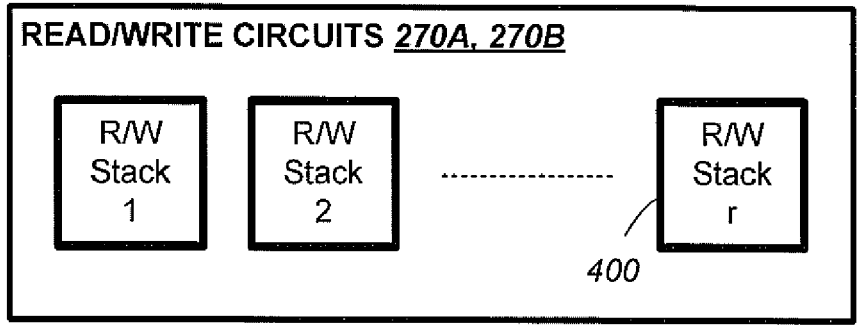
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8A:
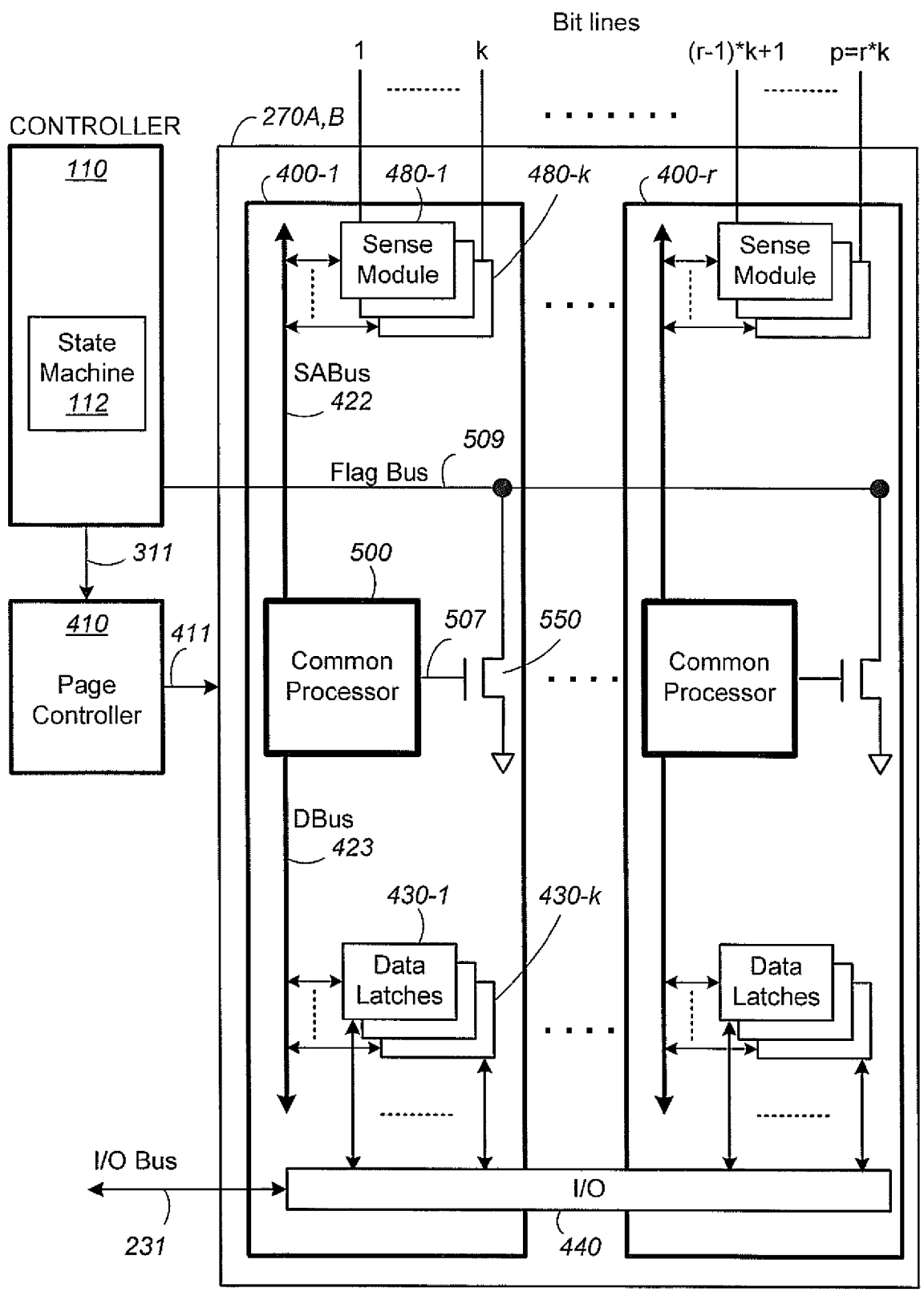
FIG. 8 illustrates in more detail the read/write stacks shown in FIG. 7.
Figure 8B:
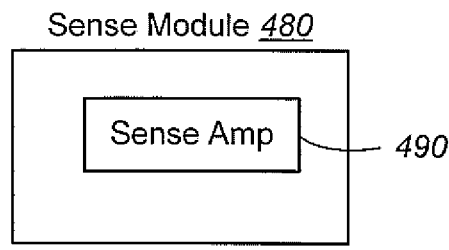

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
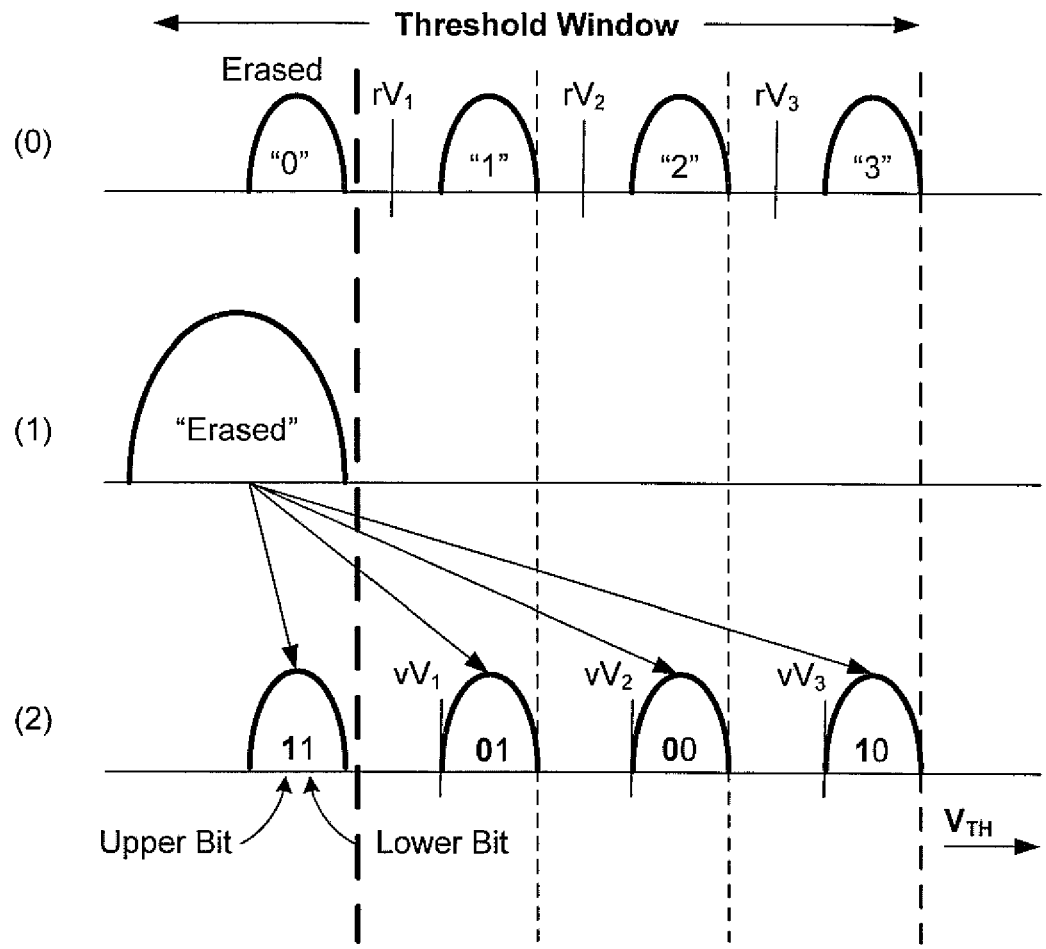
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Figure 10:
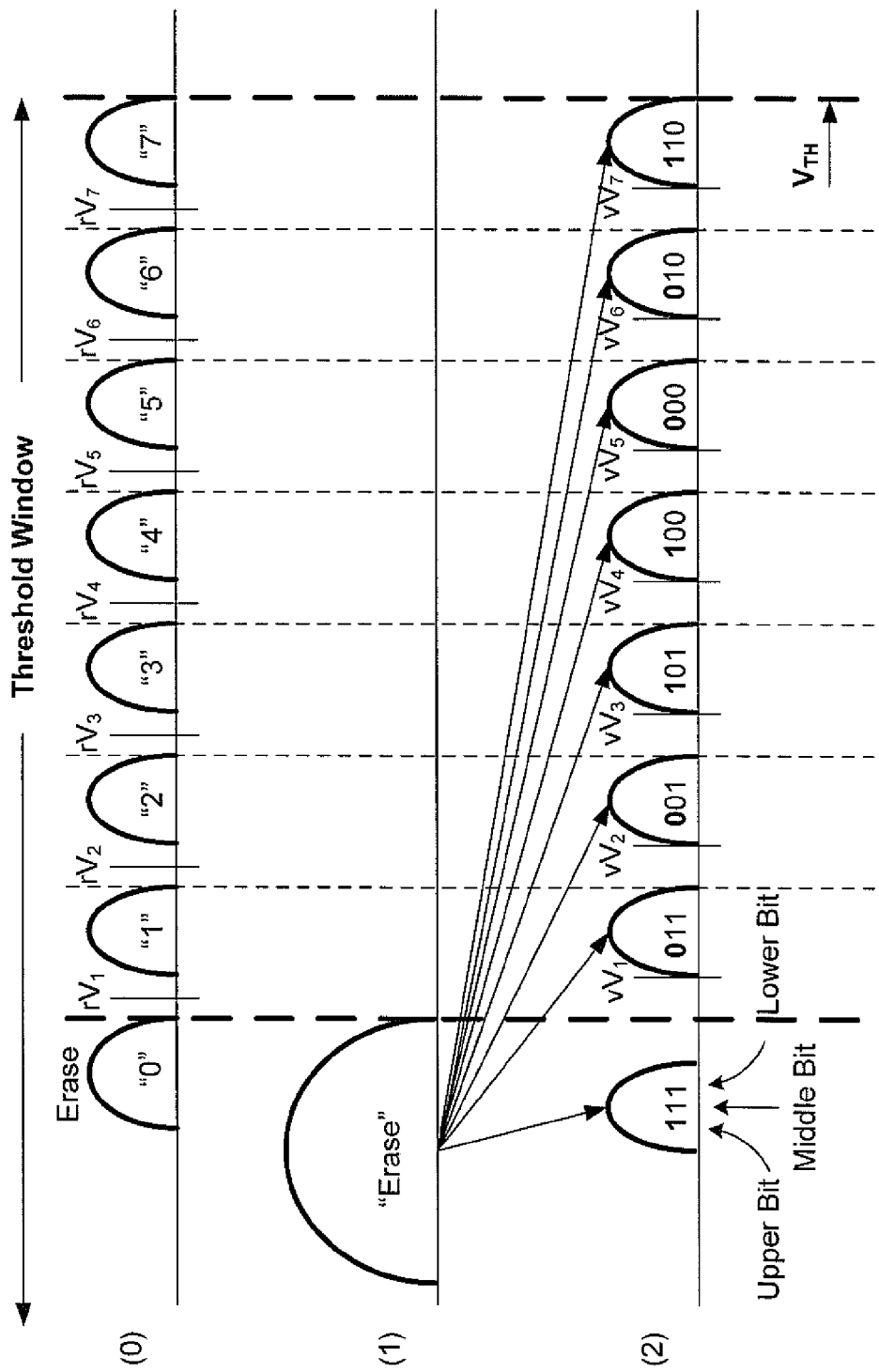
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the seven zones demarcated by verify levels $vV_1$-$vV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having lower, middle and upper bits can be used to represent each of the eight memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $rV_1$, $-rV_7$ in seven sub-passes respectively.

Similarly, a 4-bit code will have lower, first middle, second middle and upper bits, representing each of the sixteen states.

Continuous Scanning Time-Domain Sensing

Figure 11:
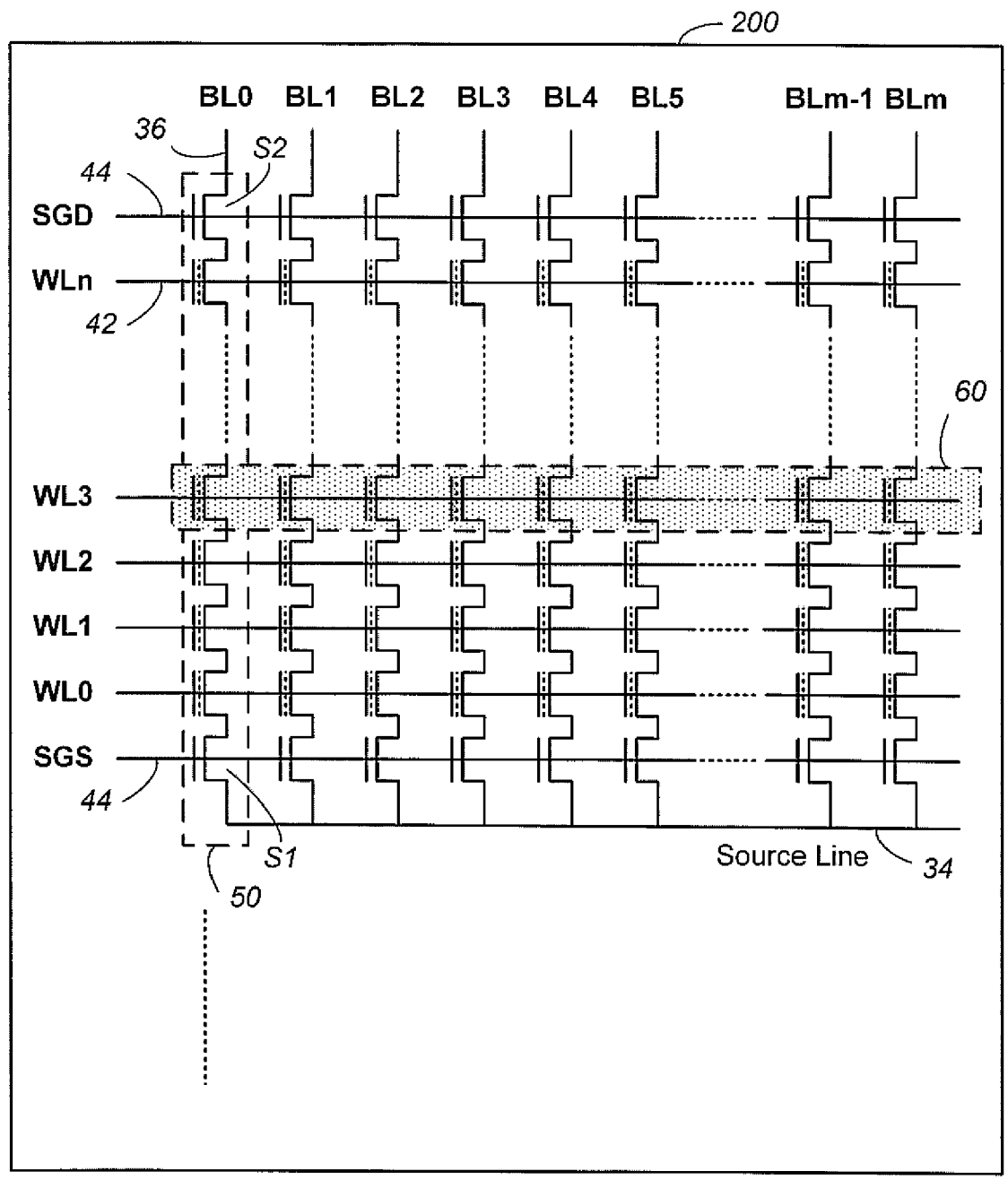
FIG. 11 illustrates a page of memory cells organized, for example in the NAND configuration, being sensed or programmed in parallel.

FIG. 11 illustrates a page of memory cells, organized for example in the NAND configuration, being sensed or programmed in parallel. FIG. 11 essentially shows a bank of NAND chains 50 in the memory array 200 of FIG. 5B, where the detail of each NAND chain is shown explicitly as in FIG. 5A. A "page" such as the page 60, is a group of memory cells enabled to be sensed or programmed in parallel. The page is enabled by the control gates of the cells of the page connected in common to a word line 42 and each cell accessible by a sensing circuit (e.g., sense module 480 shown in FIG. 8) accessible via a bit line 36. As an example, when respectively sensing or programming the page of cells 60, a sensing voltage or a programming voltage is respectively applied to the common word line WL3 together with appropriate voltages on the bit lines.

Figure 12:
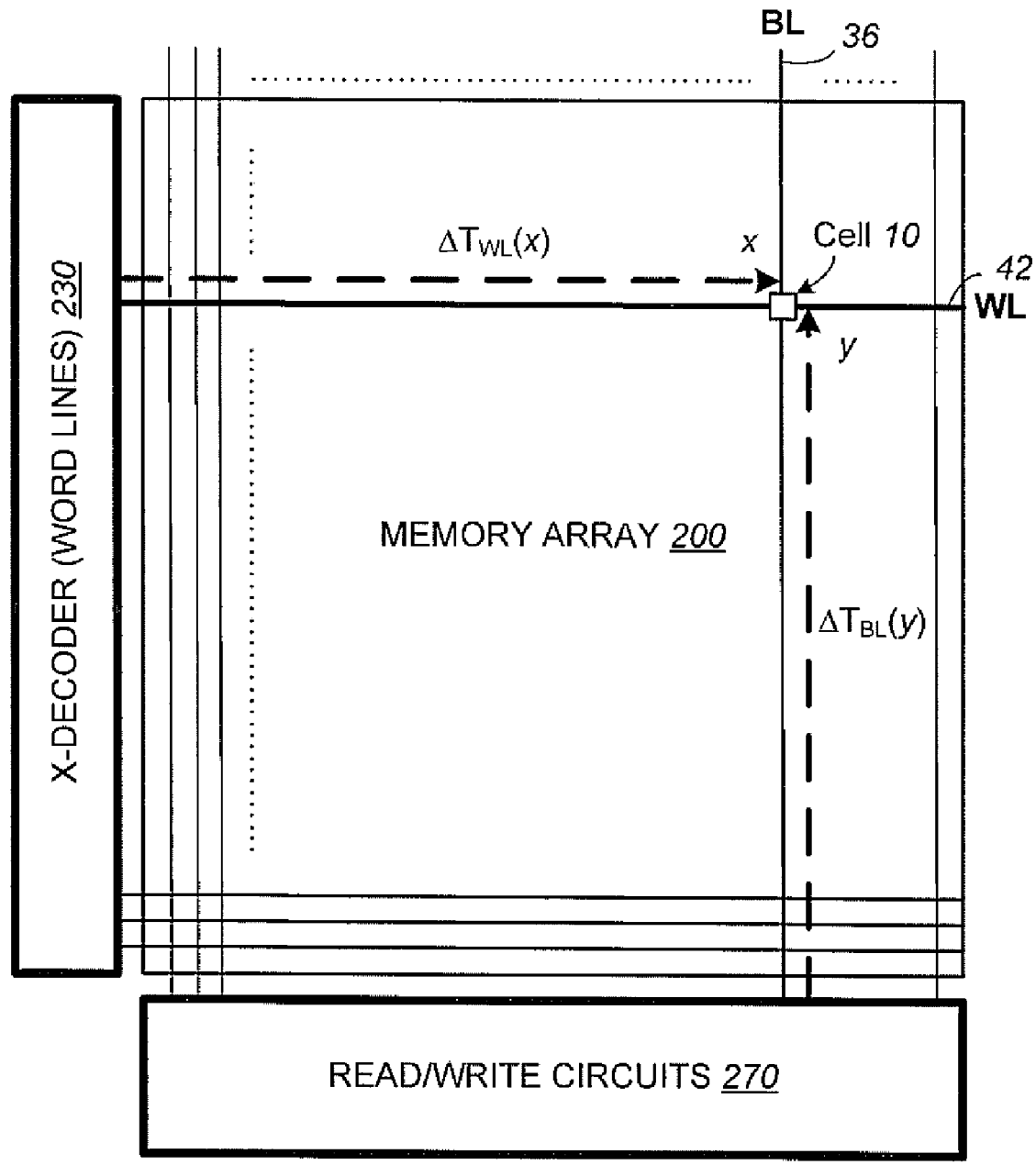
FIG. 12 illustrates the delays in accessing a given memory cell in the array.

FIG. 12 illustrates the delays in accessing a given memory cell in the array. The memory array 200 is spanned by word lines in the row direction and bit lines in the column direction. When a memory cell 10 is being accessed as part of a page, it is addressed in the x-(row) direction by the word line WL 42 and in the y-(column) direction by the bit line BL 36. During a sensing operation, a sensing voltage is supplied as a word line voltage via an x-decoder 230 from an input end of the selected word line WL. The bit lines individually couple the page of memory cells addressed by WL 42 to sense modules in the read/write circuits 270. FIG. 12 shows the read/write circuits 270 schematically and they are located at the bottom end of the y-columns. As shown in FIG. 1, a preferred configuration is for the read/write circuits to be distributed at top and bottom of the memory array as read/write circuits 270A and 270B.

Thus FIG. 12 shows one cell 10 of a page with array coordinates (x, y) accessible by the word line WL 42 and bit line BL 36. For example, during a sensing operation, a sense voltage is supplied to the control gate of the cell 10 via the word line WL 42. With the bit line BL 36 precharged to an appropriate voltage for sensing operation, the cell's source-drain current can be sensed by a sense amplifier in the read/write circuit 270 coupled via the bit line BL 36.

Due to the word lines and bit lines having finite resistance and capacitance, there will be RC delays in these lines. FIG. 12 illustrates that for the cell 10 with coordinates (x, y) from the x-decoder and the read/write circuits 270 respectively, a word line voltage applied at the x-decoder will be delayed by a period $\Delta T_{WL}(x)$. Similarly, the source-drain current at cell 10 will be sensed by one of the read/write circuits 270 delayed by a period $\Delta T_{BL}(y)$.

FIG. 13(A) illustrates a page of memory cells distributed along a word line WL 42 at positions x1, x2, . . . , xi, . . . xp from an input end. The input end of the word line is coupled to receive a word line voltage supply from the x-decoder 230.

FIG. 13(B) illustrates the product of resistance and capacitance of a given segment of the word line relative to the access node. The word line WL 42 is formed from a conductor with a finite resistance. The resistance of a segment of word line is proportional to the length of the segment. Similarly, the capacitance of a segment is also proportional to its length. Thus, the product of RC for a segment of the word line increases as a quadratic function of its length.

Figure 13:
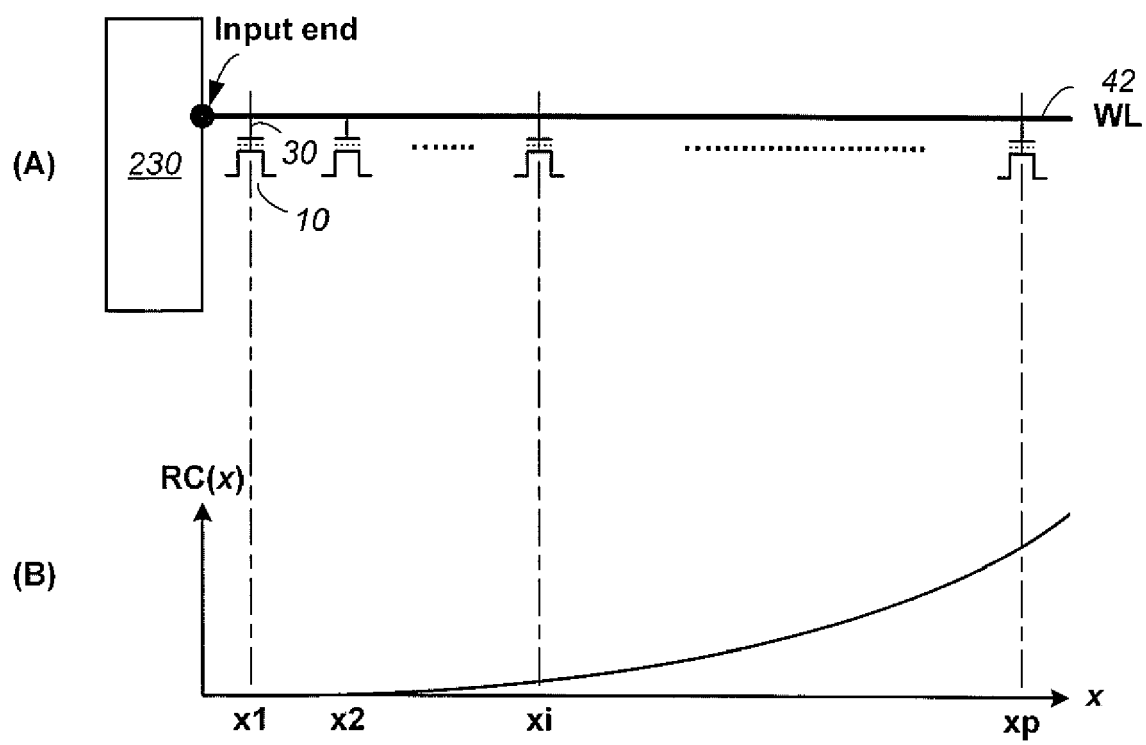
FIG. 13(A) illustrates a page of memory cells distributed along a word line WL 42 at positions x1, x2, . . . , xi, . . . xp from an input end.
FIG. 13(B) illustrates the product of resistance and capacitance of a given segment of the word line relative to the access node.
Figure 14:
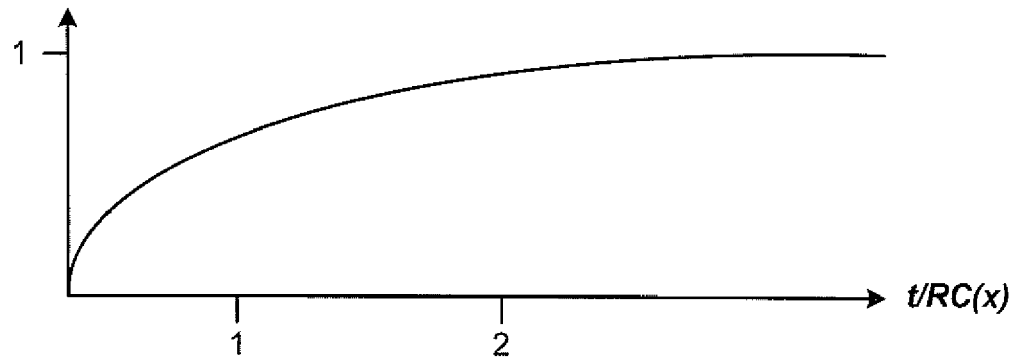
FIG. 14 illustrates the word line voltage for a given location xi as a function of time.
Figure 15:
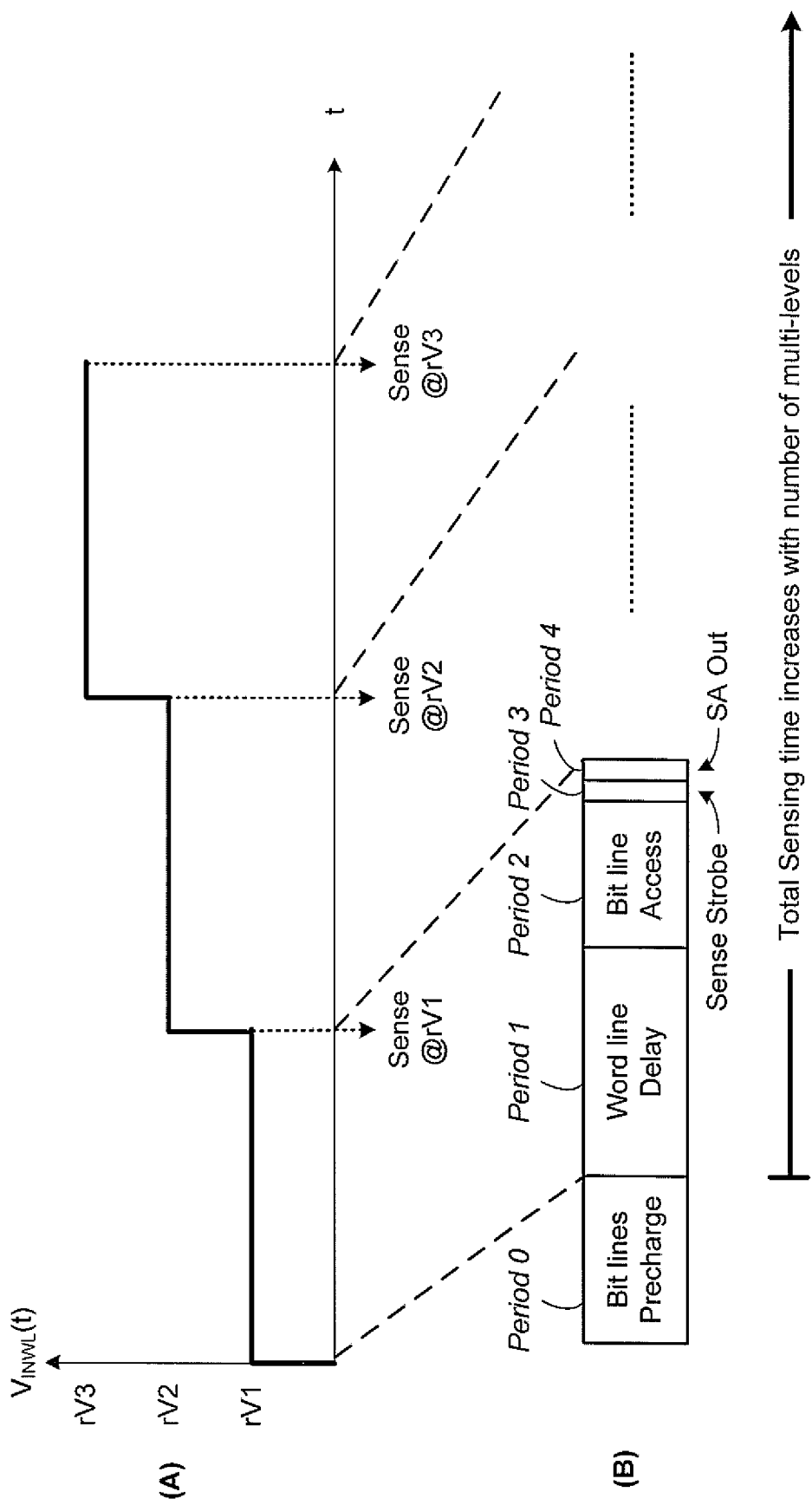
FIG. 15(A) shows that the sensing is accomplished by applying to the word line the sense voltage $V_{WL}$ which is essentially a step function that scans through levels rV1, rV2 and rV3.
FIG. 15(B) illustrates the timing for each sense level.
Figure 16:
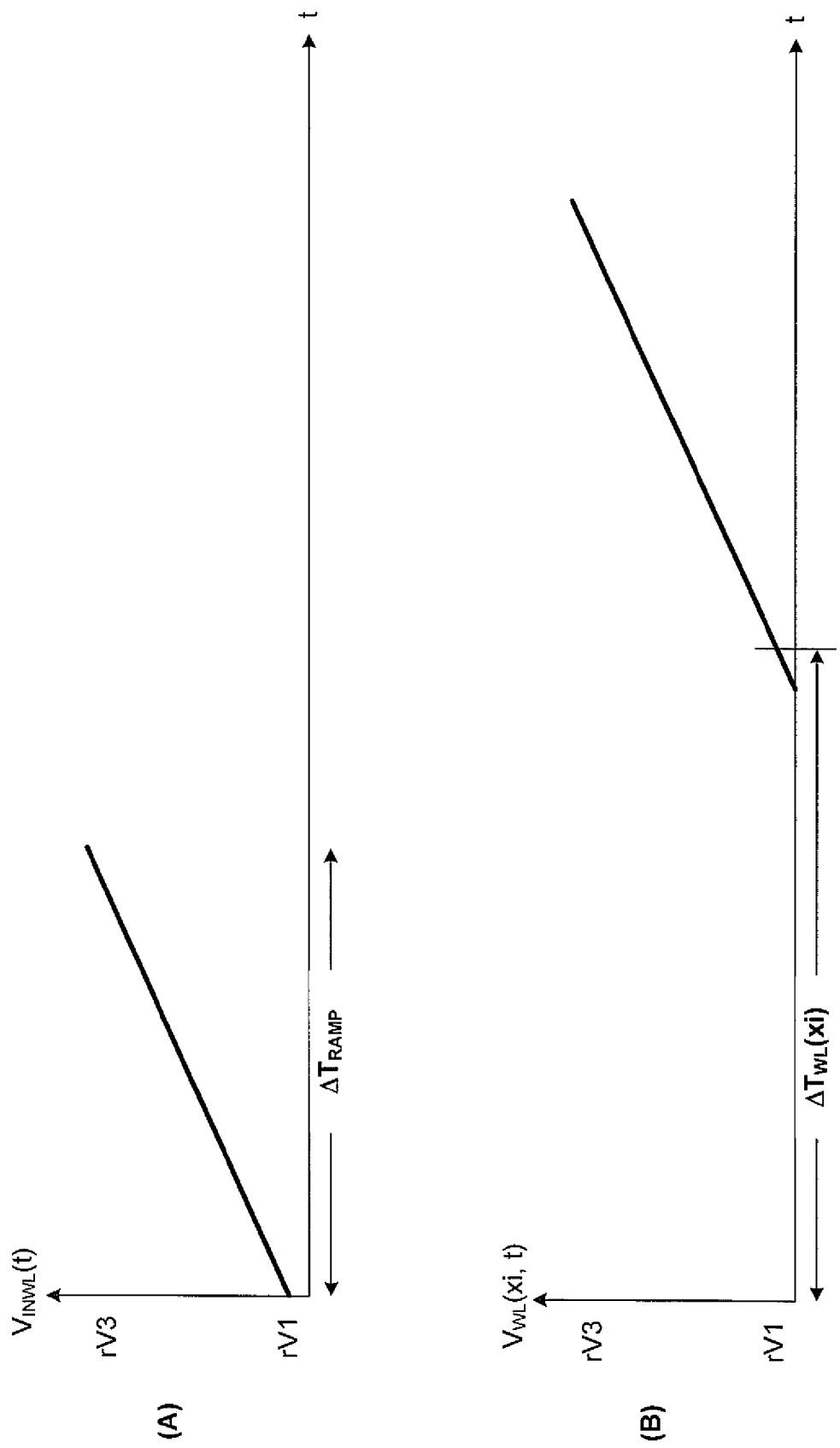
FIG. 16(A) illustrates a preferred input continuous scanning voltage for sensing all the levels of a multi-level memory cell.
FIG. 16(B) illustrates the voltage response of a word line at position xi from where the input scanning voltage is applied.

FIG. 14 illustrates the word line voltage for a given location xi as a function of time. The response to an input voltage at the input end is a charging up of a portion of the word line with time constant given by RC(xi). The charged up voltage at location xi and time t is $V_{WL}(xi, t) = V_{WL}(x=0) [1-EXP(-t/RC)]$. If later the input voltage is removed, the discharged voltage at location xi and time t is $V_{WL}(xi, t) = V_{WL}(x=0) EXP(-t/RC)$. In general, the product RC(x) (see FIG. 13(B)) is a time constant that determines the rate of charging or discharging of the word line at location x. FIG. 14 illustrates the response word line voltage normalized to the input voltage and the time normalized to the RC time constant. After one unit of time constant, the word line will be charged to 63.2 percent. After two units of time constant, the word line will be charged to 86.5 percent, etc. Thus, the greater the RC, the slower will the charging and discharging be. The effect of the RC variation along a word line is that for those cells further away from the x-decoder, the RC delay is larger and therefore will take longer time to charge up.

Delays in Multi-Level Sensing

An example partitioning of a 2-bit memory cell is shown in FIG. 9(0). The 2-bit cell can be in anyone of four memory states, each associated with a threshold range. In order to resolve in which of the threshold ranges the cell's threshold lies, sensing is performed three times, each time sensing relative to one of the read demarcation levels rV1, rV2 and rV3.

FIGS. 15(A) and 15(B) illustrate typical timings for sensing a 2-bit memory cell. FIG. 15(A) shows that the sensing is accomplished by applying to the word line the sense voltage $V_{WL}$ which is essentially a step function that scans through levels rV1, rV2 and rV3. Owning to the RC delay in the word line (shown in FIG. 14) sensing for the whole page can only take place when the far end of the word line has also charged up to the desired level.

FIG. 15(B) illustrates the timing for each sense level. In order to sense the page, the bit lines are set up with voltages appropriate for sensing operation in a bit line precharge Period 0. Sensing at rV1 level commences with application of the rV1 voltage level to the word line. After allowing for the word line delay Period 1, the word line is uniformly at the desired rV1 level. With the bit line and word line voltages set up, the cell is either turned on or off. If the cell is turned on, it means it has a threshold level of at least rV1. However, since sensing is performed by a sense amplifier in a sense module (see FIG. 8) remotely coupled to the cell via a bit line, the cell's conduction current will reach the sense amplifier after a bit line access Period 2. After that time, a sense strobe in sense Period 3 enables to sense amplifier to determine the conduction current. The sensed result is then output from the sense amplifier to a data latch in the next period which is the sense amp output Period 4.

Depending on various sensing implementations, the bit line precharge Period 0 may or may not be repeated for each of the sense levels. However, the Periods 1-4 must be repeated for each of the sense levels. An example illustrates the relative duration of each period. The sense Period 3 and output Period 4 are typically about 1 microsecond each; the word line delay and bit line access are typically about ten times longer at say, 10 microseconds each. This amounts to about 20 microseconds for each sensing levels. The initial bit lines precharge time may take another 10 microseconds. For a 2-bit cell, there are 22-1 or three levels and the total sensing time is 20×3+10=70 microseconds. For a 3-bit cell, there are 23-1 or 7 levels and the total sensing time is 20×7+10=150 microseconds. For a 4-bit cell, there are 15 levels and the total sensing time is 20×15+10=310 microseconds. It will be seen that most of the sensing time at each sense level is waiting for the word line and bit line delays, which is about one order of magnitude higher than the actual sense and output periods.

Time-Domain Sensing with Continuous Scanning Sense Voltage

According to a general aspect of the invention, a page of non-volatile multi-level memory cells on a word line is sensed in parallel by sense amps via bit lines. A predetermined input sensing voltage as an increasing function of time $V_{INWL}(t)$ applied to the word line allows scanning of the entire range of thresholds of the memory cell in one sweep. Sensing of the thresholds of individual cells is then reduced to a time-domain sensing by noting the times the individual cells become conducting. Each conducting time, adjusted for delays in the word line and the bit line, can be used to derive the sensing voltage level that developed at the portion of the word line local to the cell when the cell became conducting. This locally developed sensing voltage level yields the threshold of the cell.

In one embodiment, the voltage of the word line $V_{WL}(xi, t)$ as a function of cell position xi in response to the input $V_{INWL}(t)$ is predetermined. The page is sensed periodically and the time ti when the cell i begins to conduct is used to determine the threshold $V_{TH}i$ by evaluating the word line response function at (xi, ti), i.e. $V_{TH}i=V_{WL}(xi, ti)$.

FIG. 16(A) illustrates a preferred input continuous scanning voltage for sensing all the levels of a multi-level memory cell. The input scanning voltage $V_{INWL}(t)$ is a linear ramp voltage having a range inclusive of all the sense levels to be applied to the word line. It has a constant ramp rate and essentially scans through the range in a scanning period $\Delta T_{RAMP}$=Range/(ramp rate).

FIG. 16(B) illustrates the voltage response of a word line at position xi from where the input scanning voltage is applied. When the input scanning voltage $V_{INWL}(1)$ is input from the input end of a selected word line (see FIGS. 13(A) and 13(B)), the voltage response of the word line at a distance xi from the input end is given by $V_{WL}(xi, t)$. Also, $V_{WL}(0, t)=V_{INWL}(t)$. In the preferred embodiment, when the ramp rate of the input scanning voltage is substantially less than the RC constant of the WL, then the voltage at xi is substantially the voltage at x=0 but delayed by $\Delta T_{WL}(xi)$. Thus, the word line voltage at xi is given by $V_{WL}(xi, t)\sim V_{INWL}(t-\Delta T_{WL}(xi))$. This is the voltage that will be presented to the control gate of the cell i located at xi.

In one embodiment, the word line response voltage $V_{WL}(xi, t)$ as a response function to the input voltage $V_{INWL}(1)$ can be obtained based on the RC model described in connection with FIG. 13 and FIG. 14. In another embodiment, the word line response voltage is obtained by simulation. In one embodiment, the response function can be implemented by a lookup table where a given time is used to look up a word line voltage at a given position.

Knowing the word line response to an input scanning voltage, the threshold of a cell i at position xi can be derived by determining the time when the cell begins to conduct. Thus a time marker ti indicates the time when the cell begins to conduct. At this time, the word line voltage at xi is $V_{WL}(xi, ti)$ and is by definition the threshold voltage $V_{TH}i$ of the cell i located at xi. The threshold voltage $V_{TH}i$ is then simply given by evaluating the word line voltage function at (xi, ti). Thus $V_{TH}i=V_{WL}(xi, ti)$.

The time marker ti indicates a time local to the cell. In practice, if the cell's current is detected by a remote sense amplifier, a further delay to reach the sense amplifier must be taken into account. For example, in the arrangement shown in FIG. 12, the current is detected by a sense amplifier 490 in a sense module 480 (see FIG. 8B) among the read/write circuits 270 at the peripheral of the memory array 200. The sense amplifier is coupled to the drain of the cell via a bit line. In operation, the sense amplifier can be made to sense periodically as timed by a sensing clock signal. For example, the sense strobe may be timed to repeat every microsecond. As explained in connection with FIG. 12, the bit line will exact a delay $\Delta T_{BL}(y)$ from the cell to the sense amplifier, where y is the length of the bit line. Thus, if the cell i is detected by the sense amplifier to start conducting at time t'ij then the local time marker ti can be derived by ti=t'ij−$\Delta T_{BL}(y)$, where t'ij is the detection time for the sense amp of the cell at (x, y). In one embodiment, the bit line access $\Delta T_{BL}(y)$ can be obtained by the same RC model as the word line delay. In another embodiment, the bit line access can be obtained by simulation. Since it is constant for a group of cell along the same word line or page, it can also be measured by a differential sensing technique in which the common delay between two sensing can be subtracted out.

Figure 17:
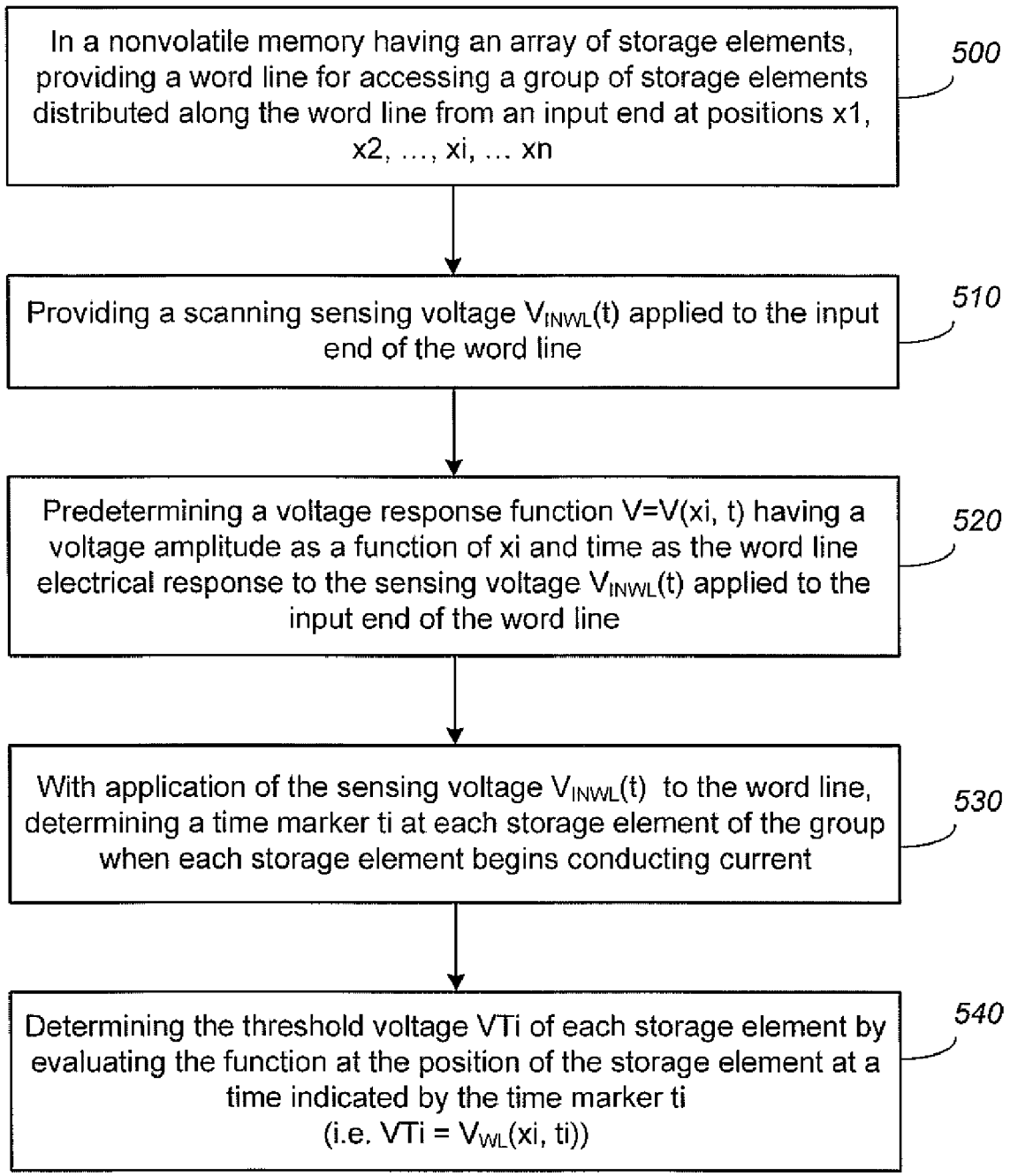
FIG. 17 is a flow diagram illustrating sensing by a continuous scanning in a time domain technique.

FIG. 17 is a flow diagram illustrating sensing by a continuous scanning in a time domain technique.

STEP 500: In a nonvolatile memory having an array of storage elements, providing a word line for accessing a group of storage elements distributed along the word line from an input end at positions x1, x2, . . . , xi, . . . xn.

STEP 510: Providing an input scanning sensing voltage $V_{INWL}(t)$ applied to the input end of the word line.

STEP 520: Predetermining a word line response function $V_{WL}(xi, t)$ having a voltage amplitude as a function of xi and time as the word line electrical response to the input scanning sensing voltage $V_{INWL}(t)$ applied to the input end of the word line.

STEP 530: With application of the sensing voltage $V_{INWL}(t)$ to the word line, determining a time marker ti at each storage element of the group when each storage element begins conducting current STEP 540: Determining the threshold voltage VTi of each storage element by evaluating the word line response function at the position of the storage element at a time indicated by the time marker ti (i.e. $VTi=V_{WL}(xi, ti)$).

In general the input scanning sensing voltage needs be one that is monotonically increasing as a function of time. As shown in FIG. 16(A), a preferred input scanning sensing voltage is a linear function with a constant ramp rate.

FIG. 18 is an additional portion of the flow diagram shown in FIG. 17 in which the input scanning voltage is preferably a linear ramp voltage.

STEP 512: Wherein the input sensing voltage $V_{INWL}(t)$ has a predetermined constant ramp rate.

FIG. 19 is an additional portion of the flow diagram shown in FIG. 17 in which a preferred implementation of the sensing is specified. The preferred sensing is by a continuous scanning technique in which the storage element's conduction is detected by a sense amplifier coupled via a bit line and the resultant delay is accounted for. As described above and also in connection with FIG. 12, the time marker is relative to the real time when the storage element i is turned on. In the case when the storage element's current is detected by a sense amplifier linked by a bit line, the detection time at the sense amplifier is delayed by the signal propagation from the storage element to the sense amplifier.

STEP 532: Wherein said determining the time marker for a storage element includes detecting the conduction current by a sense amplifier coupled to the storage element via a bit line, the time marker being the detection time at the sense amplifier offset by a predetermined delayed period.

In a preferred implementation of evaluating the word line response function at (xi, ti), it amounts to evaluating the input sensing voltage at after allowing for word line and bit line delays relative to the storage element at (xi, yi) in the memory array, with $V_{TH}i=V_{INWL}(tij-\Delta T_{WL}(xi)-\Delta T_{BL}(yi))$ where tij is the detection time for conduction at the sense amp and $\Delta T_{WL}(xi)$ and $T_{BL}(yi)$ are respectively delay in the word line and bit line relative to the storage element i.

FIG. 20 is an additional portion of the flow diagram shown in FIG. 17, in which a preferred implementation of deriving the threshold of a storage element in the continuous scanning technique is specified. As can be seen from FIGS. 16 (A) and (B), the input voltage $V_{INWL}(t)$ is applied to the word line and it is delayed by $\Delta T_{WL}(xi)$ at for storage element i at position xi down the word line. The delay can be calculated from the response function $V_{WL}(x, t)$. Thus, the voltage that develops on the word line at xi is simply given by the input voltage shifted by the delay in time, i.e., $V_{WL}(xi, t)=V_{INWL}(t-\Delta T_{WL}(xi))$. Similarly, the sense amp detects the event of the storage element's conduction delayed by the bit line at $t'=t+\Delta T_{BL}(y)$. Thus, the threshold at storage element i is given by the input voltage shifted in time by both the delays in the word line and the bit line, i.e., $V_{TH}i=V_{INWL}(t'')=V_{INWL}(t-\Delta T_{WL}(xi))=V_{INWL}(t'-\Delta T_{WL}(xi)-\Delta T_{BL}(y))$.

STEP 540': Said determining the threshold voltage VTi of each storage element by evaluating the word line response function at the position of the storage element at a time indicated by the time marker ti amounts to evaluating the input voltage function at the detection time at the sense amplifier shifted in time by a predetermined word line delay and the predetermined bit line access (i.e. $VTi=V_{WL}(xi, ti)=V_{INWL}(t'-\Delta T_{WL}(xi)-\Delta T_{BL}(y))$).

The continuous scanning sensing technique can greatly improve sensing performance particular with respect to multi-level sensing. As explained earlier in connection with FIG. 15, prior multi-level sensing schemes have the word line and bit line delays compounding with each sense level. Thus the total sense time scales with the number of sense levels.

FIGS. 21(A) and 21(B) illustrate the timing advantage in the continuous scanning sensing technique. FIG. 21(A) shows an example of the input scanning sensing voltage as a continuous ramp voltage with time.

FIG. 21(B) illustrates the timing for the total sensing time under the present scheme of continuous scan sensing in the time domain. Prior to ramping, there will be an initial bit line precharge time Period 0 that may take about 10 microseconds. This Period 0 is similar to that exists in prior sensing schemes such as that shown in FIG. 15. Once the continuous scanning sensing voltage is applied, the total time taken by the sum of the word line delay Period 1 and bit line access Period 2 as well as sensing Period 3 and output Period 4 for each infinitesimal level will be "pipelined" one after each other. Typical, the total sensing time will be given by the ramp period $\Delta T_{RAMP}$+Sum(Periods 1-4). This is somewhat independent of the number of the levels to be resolved for the multi-level memory cell. For example, assume the ramp period $\Delta T_{RAMP}$ to be about the same as the sum of Periods 1-4, the total sensing time for all levels will then be 2×Sum(Periods 1-4). In comparison, the prior methods would have a sensing time for a 3-bit cell to be approximately 7×Sum (Periods 1-4). Similarly, for comparison, the prior methods would have a sensing time for a 4-bit cell to be approximately 15×Sum(Periods 1-4).

Another advantage of the continuous scanning sensing technique is that since its sensing time is rather insensitive to the number of levels being sensed, it is practical to sense at much high resolution than the number of multi-levels of a memory cell would normally require. For example, for a 3-bit cell, one would normally need to resolve a minimum of 7 levels. However, the continuous scanning sensing technique could allow sensing to resolve 4, 5 or even higher number bits without incurring much more sensing time. The extra bits are called "soft bits" which are useful in locating the cell's threshold more accurately or to aid ECC (Error Correction Code) operations. The only expense would be more latches to store the extra soft bits.

Sensing with Pipelined Corrections for Perturbing Neighbors

According to another aspect of the invention, the time-domain sensing can be used to advantage in sensing a multi-level memory in which perturbations from the charges stored in neighboring cells ("Yupin Effect") are to be compensated for. Particularly, when the memory array is being sensed page by page with each page accessible by a word line, sensing of a word line WLn would require first sensing the states in the neighboring word line WLn+1 in order to know how much to compensate for. With multiple levels to be sensed at each word line, the total number of sensing increases with the square of multiple levels to be sensed and will become prohibitive excessive as each cell is configured to store more bits.

Perturbation from Neighboring Charge Storage Elements or Cell-To-Cell's Floating Gate Coupling ("Yupin Effect")

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

There are a number of ways to minimize and/or correct for the Yupin effect.

Minimizing the Floating Gate Coupling ("Yupin Effect") During Programming

The Yupin effect more strongly affects adjacent cells, which can be across bit lines along a row (BL-BL Yupin effect) and across word lines along a column (WL-WL Yupin effect) of a memory array. It can be mitigated by minimizing the asymmetry in field environment for a cell between the time of program-verifying and a time of reading subsequent to the neighboring cells have been programmed.

There are several ways to reduce the Yupin effect during programming. One way is perform multi-pass programming in which programming for a page of memory cells along a word line is completed in more than one pass. Typically, at least two programming passes are performed. The first pass programs all cells in the page close to their respective target states using corresponding verify levels which are offset lower than what it should normally be for the target states. A subsequent pass completes the programming using the normal verify levels with no such offset. The Yupin effect on a cell is only contributed by the changes (i.e., programming) of neighbors subsequent to the programming of the cell. When the subsequent pass is performed with a minimum change of charges among the floating gates, there will be a minimum in asymmetry in field environment between program-verify and subsequent read operations. Thus, the Yupin effect is minimized in the 2-pass programming technique. This technique can minimize BL-BL Yupin effect. As will be described later, it can also reduce WL-WL Yupin effect if the two passes are performed in a particular sequence when programming from word line to word line, U.S. Pat. No. 6,781,877 discloses a programming scheme in which WL-WL Yupin effect is also reduced by programming the pages in the memory array in an optimal order.

Figure 22:
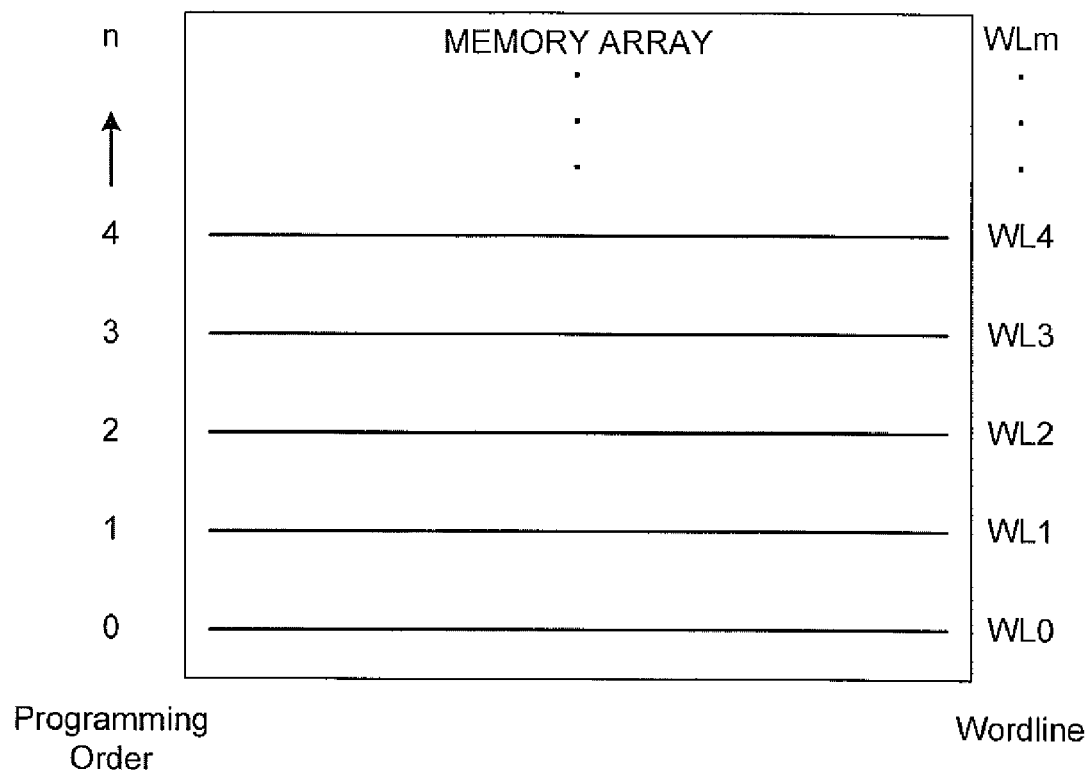
FIG. 22 illustrates an example of a memory having a memory array with its pages programmed in an optimal sequence so as to minimize the Yupin Effect between memory cells on adjacent word lines.

FIG. 22 illustrates an example of a memory having a memory array with its pages programmed in an optimal sequence so as to minimize the Yupin Effect between memory cells on adjacent word lines. The pages are programmed sequentially along a consistent direction, such as from bottom to top in the order WL0, WL1, WL2, . . . . In this way, when a particular page is being programmed, the pages on the lower side of it are already programmed. Whatever perturbative effects they may have on the current page, they are being accounted for as the current page is being program-verified in view of these perturbations. Essentially, the sequence of the programming the page should allow the current page being programmed to see a minimum of changes around its environment after it has been programmed. Thus, each programmed page such as on WLn is only perturbed by the pages on the upper side of it, such as WLn+1 or higher, and the WL-WL Yupin effect is effectively reduced in half by this programming sequence.

Thus, for WL-WL Yupin effect where the perturbations are between memory cells on adjacent word lines, it is mitigated during programming using the preferred programming scheme described above. This will effectively reduce the perturbation by half. The remaining half would still need to be corrected either during programming or read operations.

Correction for BL-BL and WL-WL Yupin Effects During Sensing

In general, sensing the threshold level of a storage element is performed in a read operation or a program-verify operation. Read and program-verify may employ a slightly different sensing level. In the present description, the terms "sensing" and "read" are sometimes used interchangeable with the understanding that the above distinction may exist. Likewise, the terms "storage element" and "memory cell" and "cell" are used interchangeable with the understanding that it applies to the instance where each cell has one storage element. In the case where one cell contains multiple storage elements, the term "cell" should be read as "storage element".

Correction for WL-WL Yupin effect during sensing can be accomplished by the Look-Ahead ("LA") technique. The LA sensing scheme has been disclosed in U.S. Pat. No. 7,196,928 and United States Patent Application Publication No. US-2006-0221714-A1 published on October, 2006, entitled, "Read Operations for Non-Volatile Storage that Includes Compensation for Coupling," which entire disclosure is herein incorporated by reference. Read with the LA correction basically examines the memory states programmed into the cells on an adjacent word line and corrects any perturbation effect they have on the memory cells being read on the current word line. If the pages have been programming according to the preferred programming scheme described above, then the adjacent word line will be from the word line (WLn+1) immediately above the current one (WLn). The LA correction scheme would require the data on the adjacent word line to be read prior to the current page.

Figure 23:
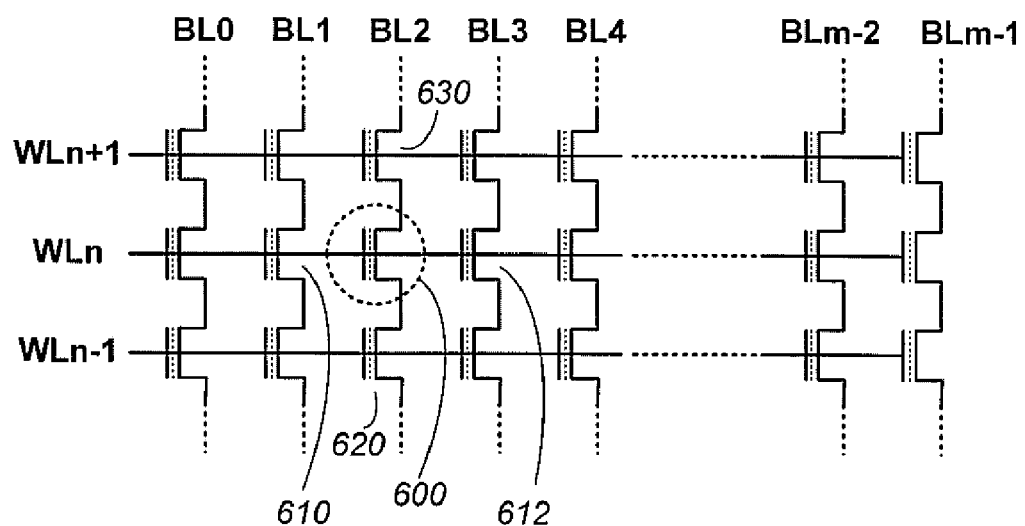
FIG. 23 illustrates a portion of a memory array for which LA correction is to be performed during a read or program operation.

FIG. 23 illustrates a portion of a memory array for which LA correction is to be performed during a read or program operation. For example, a page of memory cells connected by a word line WLn is being sensed in parallel. The Yupin effect on any one of the cells in the page, such as memory cell 600 is mostly contributed by subsequent programming of neighboring cells adjacent to the memory cell 600 being programmed. In particular, along the word line WLn, a left side neighbor is cell 610 and a right side neighbor is cell 612. Similarly, the programming cell 600 is coupled to a sense amplifier (not shown) via a bit line BL2. Alone the bit line BL2, a neighbor below the programming cell 600 on word line WLn−1 is cell 620 and a neighbor on the WLn+1 word line above is cell 630.

The neighbors to the memory cell 600 can be in any one of possible memory states, each having a different amount of charge in its charge-storage element and therefore exerting different amount of perturbation. In general, the higher programmed states will have more negative charges in the charge storage element of the cell. With four adjacent neighbors, the range of perturbation is given by the permutation of the possible memory states in these neighbors. In general the only relevant neighbors are those that will be programmed after the memory cell 1460 has completed programming. In practice, it is preferable to quantize the amount of perturbation seen by the memory cell 600 and therefore the number of compensation levels into a manageable number. For example, the number of compensation levels may be coded by one bit where "0" may denote no compensation and "1" may denote a predetermined level of compensation. In another embodiment, two bits may be used to represent up to four possible compensation levels. Higher bits are also possible.

Thus, by adjusting the sensing level on the word line of the cell to be sensed, the sensing level being as a function of the target state and the predetermined memory states of the neighboring memory cells during sensing, Yupin effect due to existing or anticipated charges on neighboring cells is compensated.

Compensation with Predetermined Offset Level Applied to a Neighboring Word line WLn+1 ("DLA Read")

An alternative, more preferred scheme for correction of Yupin effect during read is the Direct LA scheme ("DLA"). DLA is disclosed in U.S. patent application Ser. No. 11/377,972 filed on Mar. 17, 2006, entitled, "System for Performing Read Operations on Non-Volatile Storage with Compensation for Coupling," which entire disclosure is herein incorporated by reference. The DLA scheme also makes correction to the reading of a cell in the current word line by taking into account the programmed state of the adjacent cell on the next word line. Instead of simply biasing the current word line during read, the correction is effected by biasing the adjacent word line in such a way that the resultant floating-gate coupling offsets the WL-WL Yupin effect errors.

The adjusting of the sense level is effected virtually by biasing an adjacent word line accordingly so that the correct target state will be read from the cell in spite of the perturbing charges that are subsequently programmed into neighboring memory cells. This has the advantage of avoiding using a real offset on the verify level of the cell being programmed, thereby avoiding the problem of possibly having the verify level shifted too low to require negative voltage sensing when verifying the lowest memory state.

As described before the Yupin effect occurs due to the asymmetry in the charge environment experience by a cell between the time it was program-verified and the time it is read. More particular, during programming of cells on the word line WLn, the cells on WLn+1 had not been programmed and their charge storage elements have little or not negative charges. Thus, the cells in WLn were programmed verified under such an environment. Later, the cells on WLn+1 also have been programmed and now some of their charge storage elements are programmed with more negative charges. These negative charges now present a more negative charge environment when the cells on WLn are read. The effect is as if a cell on WLn is programmed with more negative charge; i.e., the cell appears more programmed with a higher threshold.

Figure 24A:
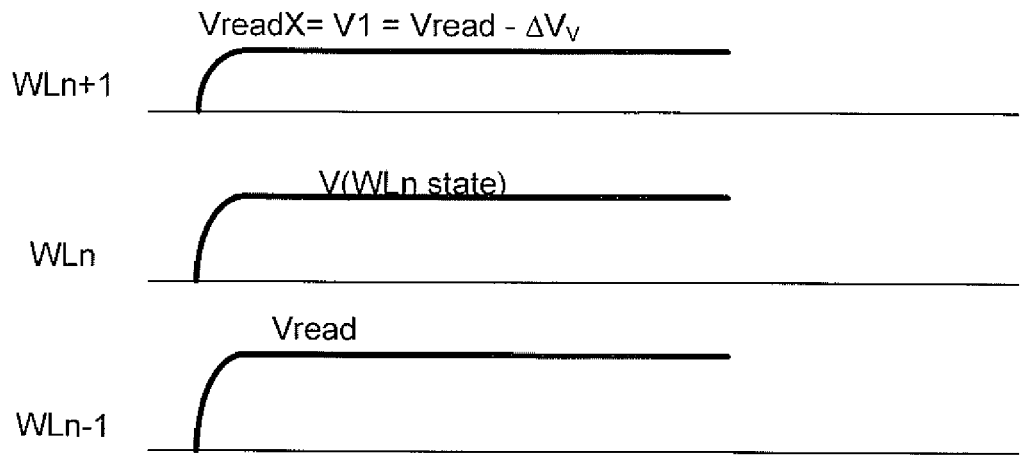
FIG. 24A illustrates the biasing conditions under the DLA scheme during program verify for the word line WLn being sensed and the neighboring word lines WLn−1 and WLn+1.
Figure 24B:
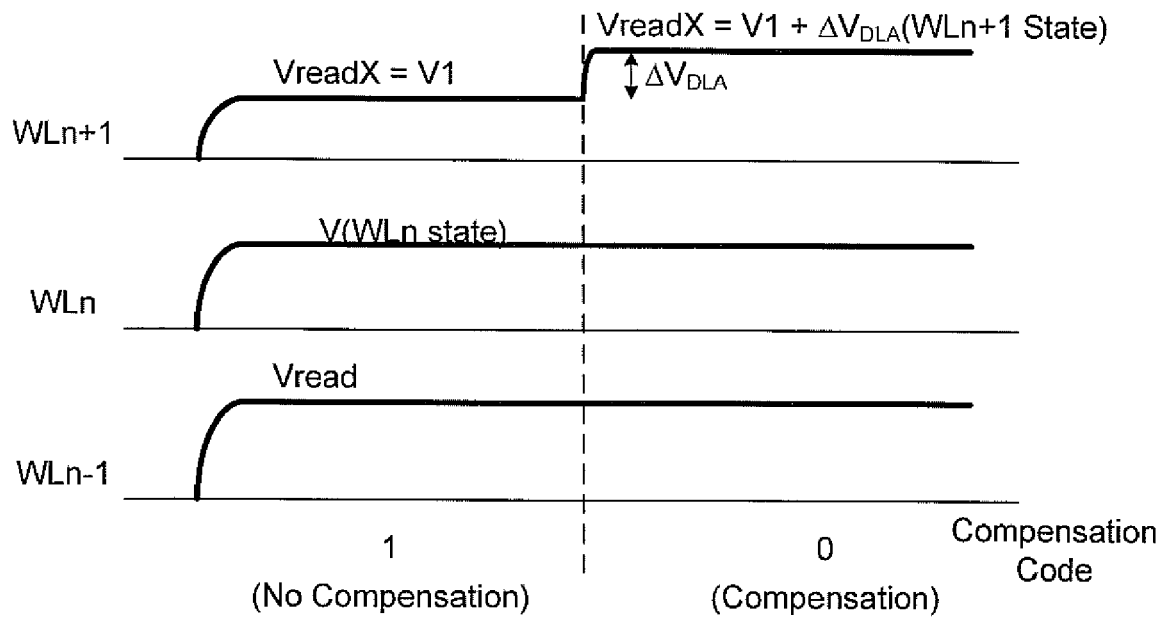
FIG. 24B illustrates the biasing conditions under the DLA scheme during a compensated read for the word line being sensed and its adjacent word lines.

FIG. 24A and FIG. 24B illustrate the biasing voltages on the word lines during respectively a program verify and a subsequent read.

FIG. 24A illustrates the biasing conditions under the DLA scheme during program verify for the word line WLn being sensed and the neighboring word lines WLn−1 and WLn+1. During program verify, the sensing voltage level applied to WLn is one of $vV_1, vV_2, \ldots$ (see FIG. 9 and FIG. 10.) In the case of a NAND cell, the neighboring cells immediately below and above the cell to be sensed are part of the same NAND string (see FIG. 11.) Therefore a voltage sufficient to turn on the neighboring cells, Vread, is applied to both WLn−1 and WLn+1. More preferably, since the cells on WLn+1 are in the erased state (as explained in connection with FIG. 22), the biasing on WLn+1 is VreadX which is substantially lower than the normal Vread and still be able to turn on the cells on WLn+1. This preferred depressed basic level will allow a differential bias boost to be applied in a subsequent read operation without having to apply an excessive word line voltage.

FIG. 24B illustrates the biasing conditions under the DLA scheme during a compensated read for the word line being sensed and its adjacent word lines. In particular, WLn is the selected word line among a NAND chain (see FIG. 2). During sensing, a selected one of the normal sense level (e.g., rV1, rV2, ...) is applied to the selected word line WLn. The rest of the unselected word lines except for WLn+1 will have a voltage Vread to turn on the other cells in the NAND chain. The word line WLn+1 will have a voltage VreadX applied to it. If no compensation is needed, VreadX would be the same as in program verify at V1. In general, VreadX is dependent on the neighboring state. The more programmed is the neighboring state, the more perturbation and the more compensation need. Compensation is effected by raising the VreadX from V1. The example shows two possible compensation levels coded by one bit.

When the neighboring cell at WLn+1 is less programmed with the total perturbation below a predetermined threshold, no compensation is employed (compensation code "1".) Therefore the biasing of WLn+1 is the same as in the program-verify case with VreadX=V1.

On the other hand, when the neighboring cell is in a more programmed state with the total perturbation above the predetermined threshold, compensation is required (compensation code "0".) In this case, compensation is effected by raising the biasing on WLn+1 by a predetermined amount with $VreadX=V1+\Delta V_{DLA}$.

While the DLA read has been illustrated with one bit correction having two compensation levels, it is clear that more compensation levels will render the compensation more precise but at the expensive of more accurate sensing at WLn+1.

As described earlier, the DLA sensing scheme would require sensing both the selected word line WLn and the adjacent word line WLn+1. The states or thresholds on WLn+1 are first determined by first sensing WLn+1 in order to know how much to compensate for. For a multi-level memory, WLn+1 will have to be sensed multiple times, each time for one of the multiple levels.

Figure 25:
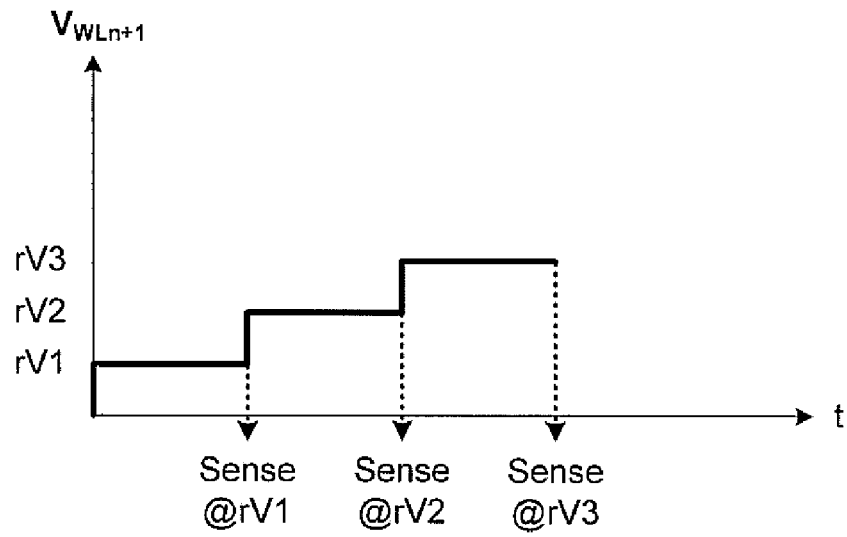
FIG. 25 is a schematic timing diagram for sensing the neighboring page at the adjacent word line WLn+1, according to a first part of a conventional DLA scheme.

FIG. 25 is a schematic timing diagram for sensing the neighboring page at the adjacent word line WLn+1, according to a first part of a conventional DLA scheme. In the first part of the DLA scheme, the states of the storage elements on WLn+1 are determined by conventional sensing techniques. The timing is similar to that shown in FIG. 15, where there is substantial delay at each sense level due to word line and bit line delays. A 2-bit memory example is given where there are three sense levels.

Figure 26:
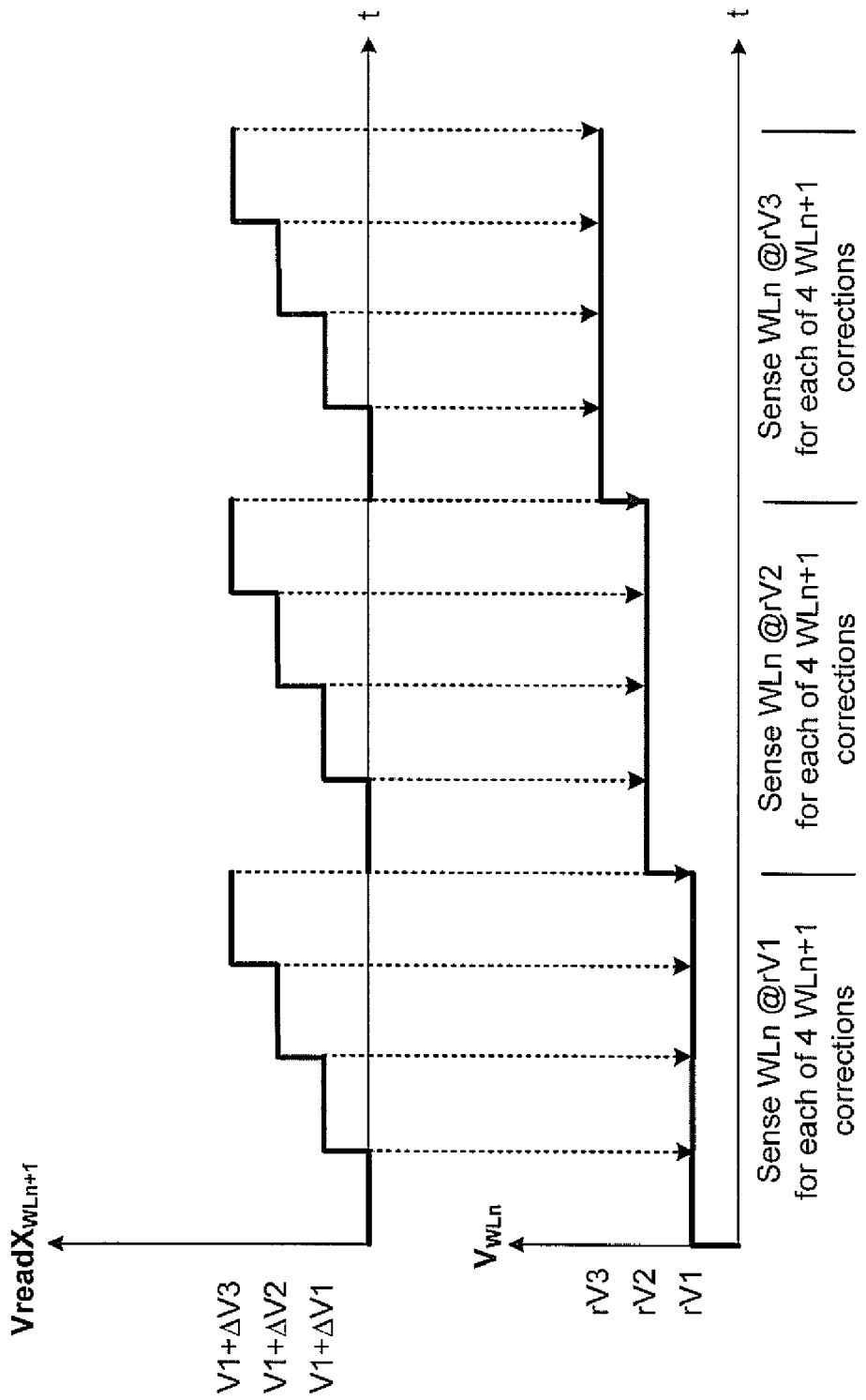
FIG. 26 is a schematic timing diagram for sensing the page at the selected word line WLn, according to a second part of a conventional DLA scheme.

FIG. 26 is a schematic timing diagram for sensing the page at the selected word line WLn, according to a second part of a conventional DLA scheme. In the second part the DLA scheme, the page at the selected word line WLn is sensed while compensating for the perturbing states on the adjacent word line WLn+1. In a 2-bit memory example, there are four possible memory states at WLn+1. The page of storage elements on WLn are divided into four groups, each group having storage elements perturbed by one of these four states. As can be seen the total sensing time in the DLA scheme is the number sense levels at WLn multiplied by the number of compensation levels on WLn+1 multiplied by the period to establish each compensation level.

Sensing in Time-Domain as Applied to DLA Read

According to another aspect of the invention, a page of non-volatile multi-level storage elements on a word line WLn is sensed in parallel while compensating for perturbations from a neighboring page on an adjacent word line WLn+1. In a "Direct Look Ahead" sensing scheme, a bias voltage depending on a neighboring state is applied to WLn+1 to compensate the cells being sensed on WLn having such a neighboring state. First, the programmed thresholds of storage elements on WLn+1 are sensed in the time domain and encoded as time markers. This is accomplished by a scanning sense voltage increasing with time. The time marker of a storage element indicates the time the storage element starts to conduct or equivalently when the scanning sense voltage has reached the threshold of the storage element. Secondly, the page on WLn is sensed while the same scanning voltage with an offset level is applied to WLn+1 as compensation. In particular, a storage element on WLn will be sensed at a time indicated by the time marker of an adjacent storage element on WLn+1, the time when the offset scanning voltage develops an appropriate state-dependent, compensating bias voltage on WLn+1.

Figure 27:
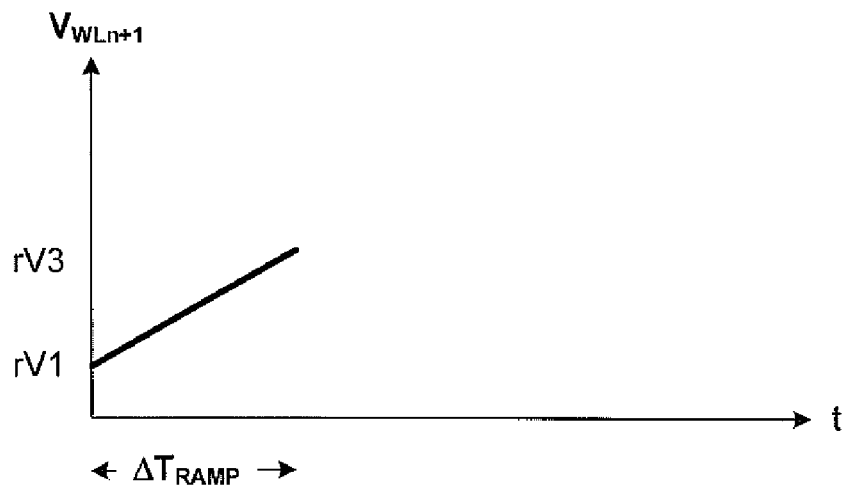
FIG. 27 illustrates a preferred continuous scanning voltage for sensing all the levels of a multi-level memory cell on the adjacent word line WLn+1.

FIG. 27 illustrates a preferred continuous scanning voltage for sensing all the levels of a multi-level memory cell on the adjacent word line WLn+1. The scanning voltage $V_{WLn+1}(t)$ is a linear ramp voltage having a range inclusive of all the sense levels to be applied to the word line. It has a constant ramp rate and essentially scans through the range in a scanning period $\Delta T_{RAMP}$=Range/(ramp rate).

Figure 28:
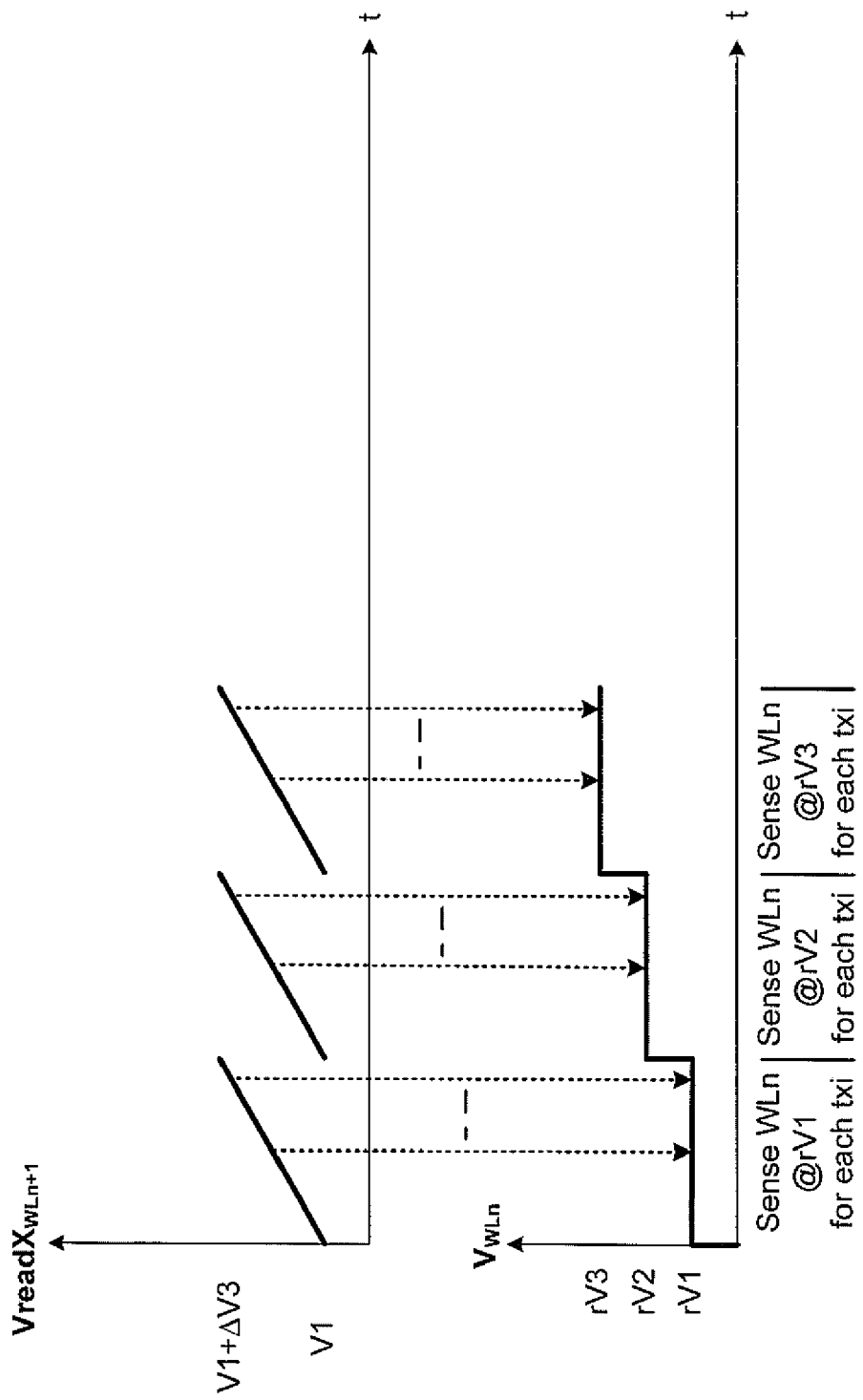
FIG. 28 is a schematic timing diagram for sensing the page at the selected word line WLn, according to a second part of the present invention.

FIG. 28 is a schematic timing diagram for sensing the page at the selected word line WLn, according to a second part of the present invention. The page at the selected word line WLn is sensed while compensating for the perturbing states on the adjacent word line WLn+1. In the time-domain scheme, the memory states at WLn+1 are detected as time markers. The page of storage elements on WLn are divided into groups, each group having storage elements perturbed by one of time markers designated states. In the present scheme, the total sensing time is the number sense levels at WLn multiplied by scan period $\Delta T_{RAMP}$.

Figure 21:
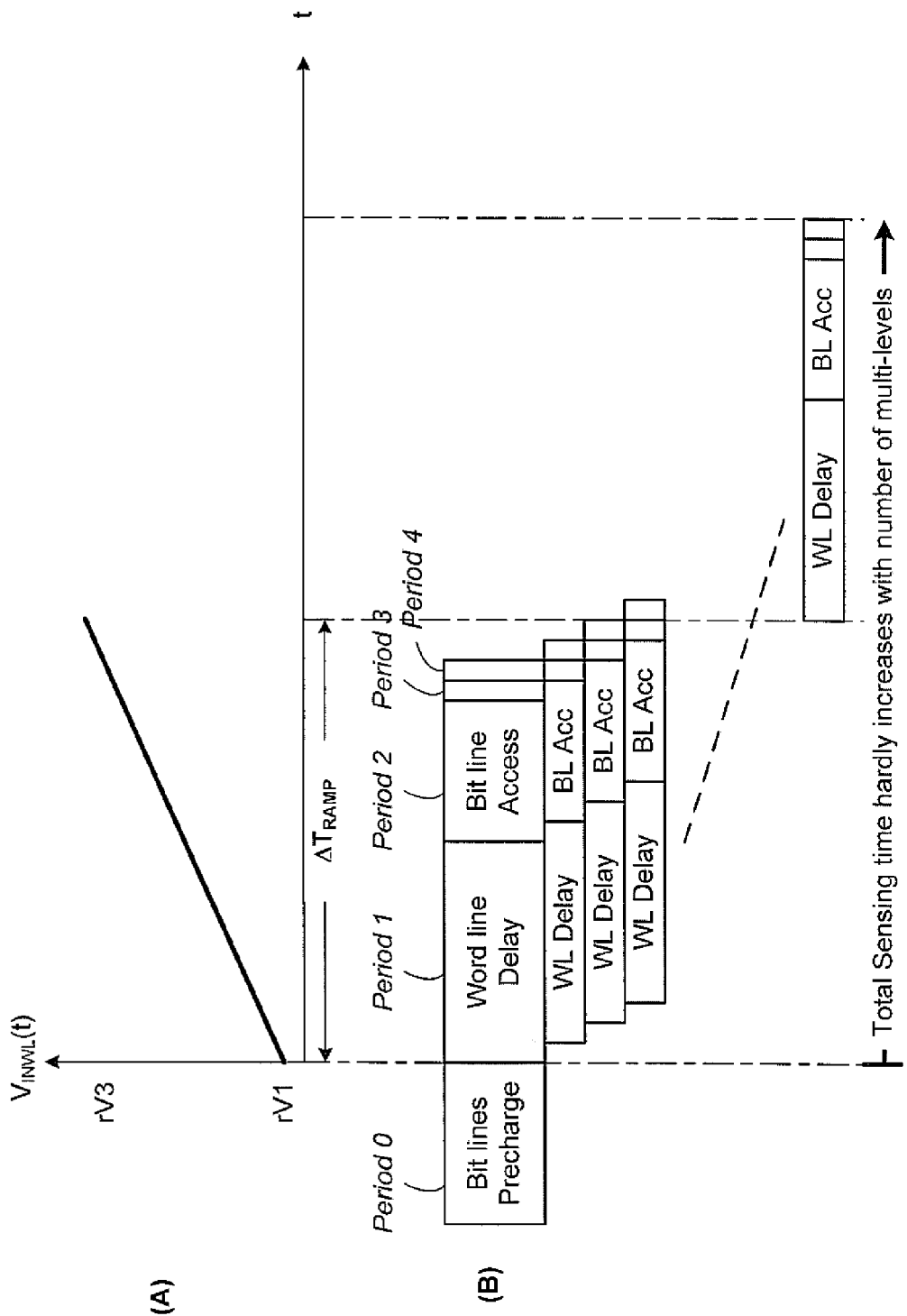
FIG. 21(A) shows an example of the input scanning sensing voltage as a continuous ramp voltage with time.
FIG. 21(B) illustrates the timing for the total sensing time under the present scheme of continuous scan sensing in the time domain.

Similar to the timing shown in FIG. 21, it will be seen the advantage of employing a continuous scanning voltage in a time-domain scheme allows the delays due to word line WLn+1 and bit line access for each voltage level to be "pipelined" and compressed.

Figure 29:
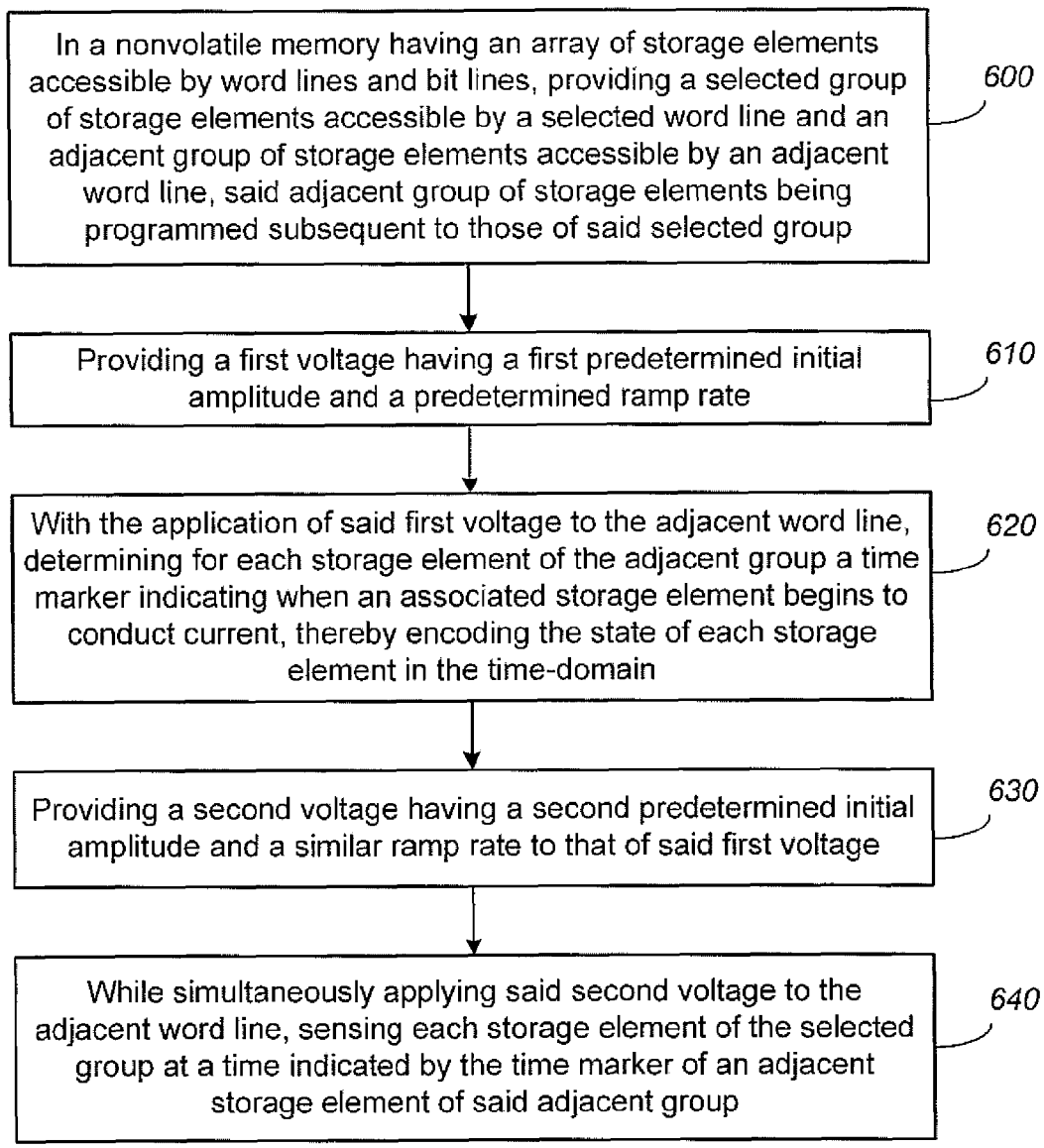
FIG. 29 is a flow diagram illustrating sensing by employing a continuous scanning sense voltage to sense in the time domain.

FIG. 29 is a flow diagram illustrating sensing by employing a continuous scanning sense voltage to sense in the time domain.

STEP 600: In a nonvolatile memory having an array of storage elements accessible by word lines and bit lines, providing a selected group of storage elements accessible by a selected word line and an adjacent group of storage elements accessible by an adjacent word line, said adjacent group of storage elements being programmed subsequent to those of said selected group.

STEP 610: Providing a first voltage having a first predetermined initial amplitude and a predetermined ramp rate.

STEP 620: With the application of said first voltage to the adjacent word line, determining for each storage element of the adjacent group a time marker indicating when an associated storage element begins to conduct current, thereby encoding the state of each storage element in the time-domain.

STEP 630: Providing a second voltage having a second predetermined initial amplitude and a similar ramp rate to that of said first voltage.

STEP 640: While simultaneously applying said second voltage to the adjacent word line, sensing each storage element of the selected group at a time indicated by the time marker of an adjacent storage element of said adjacent group.

In general the input scanning sensing voltage needs be one that is monotonically increasing as a function of time.

Figure 30:
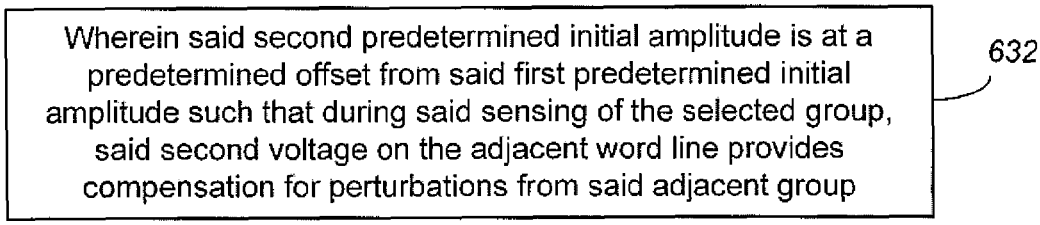
FIG. 30 is an additional portion of the flow diagram shown in FIG. 29, in which the second voltage is further specified.

FIG. 30 is an additional portion of the flow diagram shown in FIG. 29, in which the second voltage is further specified.

STEP 632: Wherein said second predetermined initial amplitude is at a predetermined offset from said first predetermined initial amplitude such that during said sensing of the selected group, said second voltage on the adjacent word line provides compensation for perturbations from said adjacent group.

Prior DLA schemes require each of the multiple levels of the multi-level memory to be sensed on the current word line WLn and sensing at each of these levels is further multiplied by the number compensation levels on the adjacent word line WLn+1. Owning to the delay in the word line and bit line access, sufficient time (e.g., about 20 microseconds) must be allowed before the entire length of WLn+1 is precharged to the desired compensation level and the sensing at WLn is completed. The total DLA sensing time is therefore compounded by the delays in setting up each compensation level on WLn+1 and bit line access thereafter.

In the present inventive scheme, the offset scanning voltage applies the various compensation levels on the adjacent word line WLn+1 in one sweep and the word line delay and bit line access period for each infinitesimal compensation level will be "pipelined" one after each other. This results in substantial reduction of the total setup time for all the compensation levels and therefore in improved sensing performance. Substantial improvement in DLA sensing can be realized.

The present inventive scheme is also advantageous in reducing power consumption. With fast ramp timing and pipelined operations, especially that of bit line operations, the average current consumption is substantially reduced.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. In a nonvolatile memory having an array of storage elements accessible by word lines and bit lines, providing a selected group of storage elements accessible by a selected word line and an adjacent group of storage elements accessible by an adjacent word line, a method of sensing the page of storage elements in parallel, comprising:

providing a first voltage having a first predetermined initial amplitude and a predetermined ramp rate;

with the application of said first voltage to the adjacent word line, determining for each storage element of the adjacent group a time marker indicating when an associated storage element begins to conduct current, thereby encoding the state of each storage element in the time-domain;

providing a second voltage having a second predetermined initial amplitude and a similar ramp rate to that of said first voltage; and while simultaneously applying said second voltage to the adjacent word line, sensing each storage element of the selected group at a time indicated by the time marker of a storage element of said adjacent group next to said each storage element.

2. The method as in claim 1, wherein:
said adjacent group of storage elements is programmed subsequent to those of said selected group.

3. The method as in claim 1, wherein:
said first voltage increases monotonically with time.

4. The method as in claim 1, wherein:
said first voltage has a predetermined constant ramp rate.

5. The method as in claim 1, wherein the nonvolatile storage elements are part of flash memory cells.

6. The method as in claim 1, wherein the array of nonvolatile storage elements is organized in a NAND configuration.

7. The method as in claim 1, wherein:
said second predetermined initial amplitude is at a predetermined offset from said first predetermined initial amplitude such that during said sensing of the selected group, said second voltage on the adjacent word line provides compensation for perturbations from said adjacent group.

8. The method as in claim 7, wherein:
said adjacent group of storage elements is programmed subsequent to those of said selected group.

9. The method as in claim 7, wherein:
said first voltage increases monotonically with time.

10. The method as in claim 7, wherein:
said first voltage has a predetermined constant ramp rate.

11. The method as in claim 7, wherein the nonvolatile storage elements are part of flash memory cells.

12. The method as in claim 7, wherein the array of nonvolatile storage elements is organized in a NAND configuration.

13. A nonvolatile memory, comprising:
an array of storage elements;
a selected word line for accessing a selected group of storage elements in parallel;
an adjacent word line for accessing an adjacent group of storage elements in parallel;
a first voltage having a first predetermined initial amplitude and a predetermined ramp rate;
sense amplifiers, in a first pass, sensing the adjacent group of storage elements in response to said first voltage being applied to the adjacent word line and determining a time marker indicating when an associated storage element begins to conduct current, thereby encoding the state of each storage element of the adjacent group in the time-domain;
a second voltage proportional to said first voltage; and
said sense amplifiers, in a second pass, sensing the selected group of storage elements on said word line while said second voltage is applied to said adjacent word line, wherein each storage element of the selected group is sensed at a time indicated by the time marker of a storage element of said adjacent group next to said each storage element.

14. The nonvolatile memory as in claim 13, wherein:
said adjacent group of storage elements is programmed subsequent to those of said selected group.

15. The nonvolatile memory as in claim 13, wherein:
said first voltage increases monotonically with time.

16. The nonvolatile memory as in claim 13, wherein:
said first voltage has a predetermined constant ramp rate.

17. The nonvolatile memory as in claim 13, wherein the nonvolatile storage elements are part of flash memory cells.

18. The nonvolatile memory as in claim 13, wherein the array of nonvolatile storage elements is organized in a NAND configuration.

19. The nonvolatile memory as in claim 13, wherein:
said second predetermined initial amplitude is at a predetermined offset from said first predetermined initial amplitude such that during said sensing of the selected group, said second voltage on the adjacent word line provides compensation for perturbations from said adjacent group.

* * * * *